(12) United States Patent
Toda

(10) Patent No.: US 12,519,447 B2
(45) Date of Patent: Jan. 6, 2026

(54) ELECTRONIC COMPONENT AND COMMUNICATION APPARATUS

(71) Applicant: TDK CORPORATION, Tokyo (JP)

(72) Inventor: Shinichiro Toda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 258 days.

(21) Appl. No.: 18/229,773

(22) Filed: Aug. 3, 2023

(65) Prior Publication Data

US 2023/0378926 A1    Nov. 23, 2023

Related U.S. Application Data

(63) Continuation of application No. PCT/JP2022/011348, filed on Mar. 14, 2022.

(30) Foreign Application Priority Data

Mar. 17, 2021  (JP) .................................. 2021-044037
Feb. 21, 2022  (JP) .................................. 2022-024541

(51) Int. Cl.
*H03H 7/00*     (2006.01)
*H03H 7/01*     (2006.01)
*H03H 1/00*     (2006.01)

(52) U.S. Cl.
CPC ........ *H03H 7/0115* (2013.01); *H03H 7/1775* (2013.01); *H03H 2001/0085* (2013.01)

(58) Field of Classification Search
CPC .... H03H 7/0123; H03H 7/0115; H03H 7/075; H03H 7/1741; H03H 7/00
USPC .......................... 333/17.3, 32, 100, 124, 185
See application file for complete search history.

(56) References Cited

U.S. PATENT DOCUMENTS

| 5,650,756 A | 7/1997 | Hayashi |
| 6,748,207 B1 | 6/2004 | Tochigi et al. |
| 11,784,385 B2 * | 10/2023 | Yang ...................... H03H 11/36 333/124 |
| 11,972,894 B2 * | 4/2024 | Ogata ........................ H01P 5/16 |
| 2014/0342676 A1 | 11/2014 | Chang et al. |

(Continued)

FOREIGN PATENT DOCUMENTS

| JP | 2000-077873 A | 3/2000 |
| JP | 2001-016063 A | 1/2001 |

(Continued)

OTHER PUBLICATIONS

May 24, 2022 International Search Report issued in International Patent Application No. PCT/JP2022/011348.

(Continued)

*Primary Examiner* — Hai L Nguyen
(74) *Attorney, Agent, or Firm* — Oliff PLC

(57) ABSTRACT

An electronic component includes a first input/output port, a second input/output port, a third input/output port, a first circuit that is a characteristic impedance converter circuit provided between the first input/output port and the second input/output port, a second circuit that is a characteristic impedance converter circuit provided between the first input/output port and the third input/output port, and a third circuit provided between the second input/output port and the third input/output port, the third circuit having a circuit configuration where a complex conjugate relationship is made with each of the first and second circuits.

14 Claims, 26 Drawing Sheets

(56) References Cited

U.S. PATENT DOCUMENTS

2017/0346452 A1 11/2017 Wada et al.
2021/0167482 A1 6/2021 Ogata et al.

FOREIGN PATENT DOCUMENTS

| JP | 2008-131622 A | 6/2008 |
|----|---------------|--------|
| JP | 2008-172358 A | 7/2008 |
| JP | 2012-080397 A | 4/2012 |
| WO | 2016/133028 A1 | 8/2016 |
| WO | 2020/045576 A1 | 3/2020 |

OTHER PUBLICATIONS

Sep. 12, 2023 International Preliminary Report on Patentability issued in International Patent Application No. PCT/JP2022/011348.

\* cited by examiner

ELECTRONIC COMPONENT AND COMMUNICATION APPARATUS

BACKGROUND

1. Field of the Invention

The present disclosure relates to an electronic component used in a communication apparatus and the communication apparatus.

2. Description of the Related Art

In recent years, various apparatuses, including not only portable wireless communication apparatuses such as portable telephones, portable information terminals and human body-wearable terminals, but also automobiles, flying bodies, and other transportation apparatuses, as well as traffic signal devices, household electrical apparatuses, industrial devices, and measuring devices, have wireless communication functions. With the spread of such apparatuses, various equipment such as apparatuses, devices, and sensors are connected via wireless communication. Some of these apparatuses also have a broadcast reception function.

Some communication apparatuses having a wireless communication function and a broadcast reception function include a plurality of antennas for stabilization of the wireless communication and for stabilization of the broadcast reception. One of the electronic components used in the communication apparatuses provided with the plurality of antennas is a divider and combiner. The divider and combiner is used to divide a signal to a plurality of antennas, and to combine a plurality of signals received by the plurality of antennas.

U.S. Pat. Nos. 5,650,756 A, 6,748,207 B1, and JP 2008-172358 A disclose a divider and combiner that divides and combines high-frequency signals. JP 2000-77873 A discloses a high-power divider/combiner that divides and combines high-power high-frequency signals. JP 2000-77873 A discloses that eight Wilkinson circuits, each having two distribution constant lines and a resistor, are connected in cascade to provide a high-power divider/combiner for a wider band.

There is an increasing demand for smaller, thinner, and higher-performance communication apparatuses having a wireless communication function and a broadcast reception function, and there is also a demand for smaller, thinner and higher-performance electronic components for use in the communication apparatuses. On the other hand, to achieve high-speed and high-function wireless communication and to achieve high-speed and high-function broadcasting, development of wireless communication systems and broadcasting systems having a wider signal bandwidth than before is in progress. Therefore, the communication apparatuses and the electronic components used in the communication apparatuses are required to support a plurality of wireless communication systems and a plurality of broadcasting systems and to support a wider band.

For example, as disclosed in JP 2000-77873 A, the conventional divider and combiner can achieve a wider band by multi-staging. However, this increases the size of the divider and combiner.

SUMMARY

One of the objects of the present disclosure is to provide an electronic component and a communication apparatus that are usable in a wide frequency band.

An electronic component according to the present disclosure includes a first input/output port, a second input/output port, a third input/output port, a first circuit that is a characteristic impedance converter circuit provided between the first input/output port and the second input/output port, a second circuit that is a characteristic impedance converter circuit provided between the first input/output port and the third input/output port, and a third circuit provided between the second input/output port and the third input/output port, the third circuit having a circuit configuration where a complex conjugate relationship is made with each of the first and second circuits.

In the electronic component according to the present disclosure, each of the first to third circuits may include at least one inductor and at least one capacitor. In this case, the at least one inductor in the third circuit may be provided in the third circuit so as to be in a complex conjugate relationship with the at least one capacitor in each of the first and second circuits. The at least one capacitor in the third circuit may be provided in the third circuit so as to be in a complex conjugate relationship with the at least one inductor in each of the first and second circuits.

When each of the first to third circuits includes the at least one inductor and the at least one capacitor, the first circuit may include, as the at least one inductor and the at least one capacitor, a first inductor provided in a first path that connects the first input/output port and the second input/output port, and a first capacitor provided between the first path and a ground. The second circuit may include, as the at least one inductor and the at least one capacitor, a second inductor provided in a second path that connects the first input/output port and the third input/output port, and a second capacitor provided between the second path and the ground. The third circuit may include, as the at least one inductor and the at least one capacitor, a third capacitor connected in series with the first inductor, a fourth capacitor connected in series with the second inductor, and a third inductor. The third circuit may further include a resistor element. The third inductor and the resistor element may be provided in parallel between the third capacitor and the fourth capacitor.

When each of the first to third circuits includes the at least one inductor and the at least one capacitor, the first circuit may include, as the at least one inductor and the at least one capacitor, a first inductor provided in a first path that connects the first input/output port and the second input/output port, and a first capacitor. The second circuit may include, as the at least one inductor and the at least one capacitor, a second inductor provided in a second path that connects the first input/output port and the third input/output port, and a second capacitor. The first capacitor and the second capacitor may be connected to each other. The third circuit may include, as the at least one inductor and the at least one capacitor, a third capacitor connected in series with the first inductor, a fourth capacitor connected in series with the second inductor, and a third inductor. The third circuit may further include a resistor element, and the third inductor and the resistor element may be provided in parallel between the third capacitor and the fourth capacitor.

When the third circuit includes the third capacitor, the fourth capacitor, the third inductor, and the resistor element, the third circuit may have a circuit configuration that is symmetrical about the third inductor and the resistor element.

In the electronic component according to the present disclosure, the first circuit may include, as the at least one inductor and the at least one capacitor, a first capacitor provided in a first path that connects the first input/output port and the second input/output port, and a first inductor provided between the first path and a ground. The second circuit may include, as the at least one inductor and the at least one capacitor, a second capacitor provided in a second path that connects the first input/output port and the third input/output port, and a second inductor provided between the second path and the ground. The third circuit may include, as the at least one inductor and the at least one capacitor, a third inductor connected in series with the first capacitor, a fourth inductor connected in series with the second capacitor, and a third capacitor. The third circuit may further include a resistor element. The third capacitor and the resistor element may be provided in parallel between the third inductor and the fourth inductor. In this case, the third circuit may have a circuit configuration that is symmetrical about the third capacitor and the resistor element.

In the electronic component according to the present disclosure, the first circuit and the second circuit may each be connected to the ground.

In the electronic component according to the present disclosure, the first circuit and the second circuit may be connected through a plurality of paths without via the third circuit. In this case, each of the first circuit and the second circuit may not be connected to the ground.

The electronic component according to the present disclosure may further include a fourth input/output port, a fourth circuit that is a characteristic impedance converter circuit provided between the first input/output port and the fourth input/output port, and a fifth circuit provided between the third input/output port and the fourth input/output port, the fifth circuit having a circuit configuration where a complex conjugate relationship is made with each of the second and fourth circuits. In this case, the second circuit may be connected to the first circuit through a plurality of paths without via the third circuit, and be connected to the fourth circuit through a plurality of paths without via the fifth circuit.

The electronic component according to the present disclosure may further include a matching circuit provided between the first input/output port and the first and second circuits. In this case, the first circuit, the second circuit, and the matching circuit may branch from one node. The matching circuit may include at least one matching circuit capacitor provided in a third path that connects the first input/output port and the node, and at least one matching circuit inductor provided between the third path and the ground.

The electronic component according to the present disclosure may be a divider and combiner.

A communication apparatus according to the present disclosure includes the electronic component according to the present disclosure, and at least one antenna that is connected to the electronic component.

In the electronic component according to the present disclosure, a first circuit is provided between a first input/output port and a second input/output port, a second circuit is provided between the first input/output port and a third input/output port, and a third circuit is provided between the second input/output port and the third input/output port, the third circuit having a circuit configuration where a complex conjugate relationship is made with each of the first and second circuits. As a result, the present disclosure demonstrates the effect of being able to implement an electronic component and a communication apparatus that are usable in a wide frequency band.

Other and further objects, features, and advantages of the present disclosure will appear more fully from the following description.

DETAILED DESCRIPTION

First Embodiment

Figure 1:
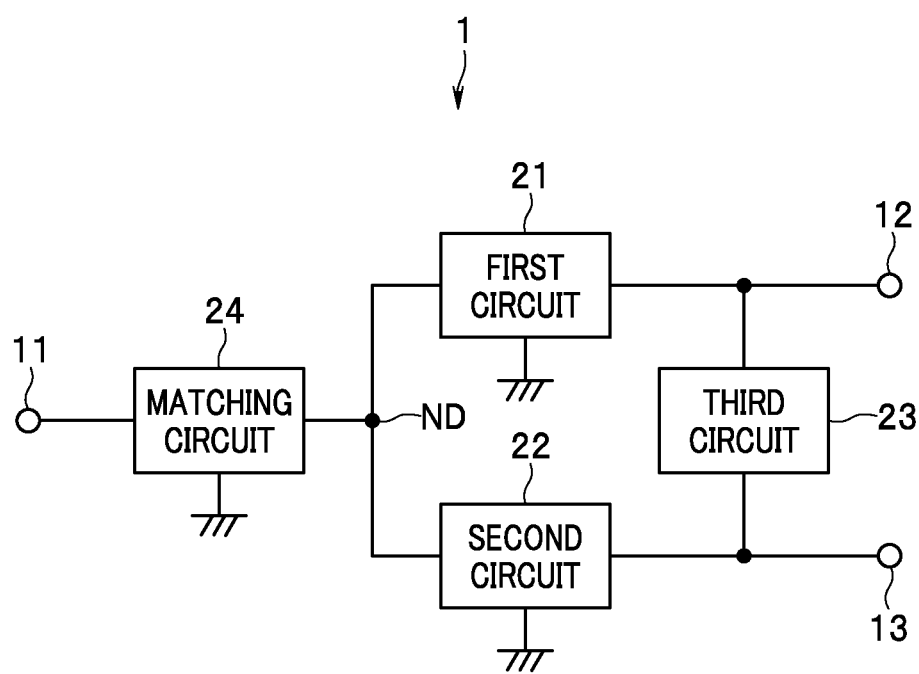
FIG. 1 is a block diagram showing a configuration of an electronic component according to a first embodiment of the present disclosure.
Figure 2:
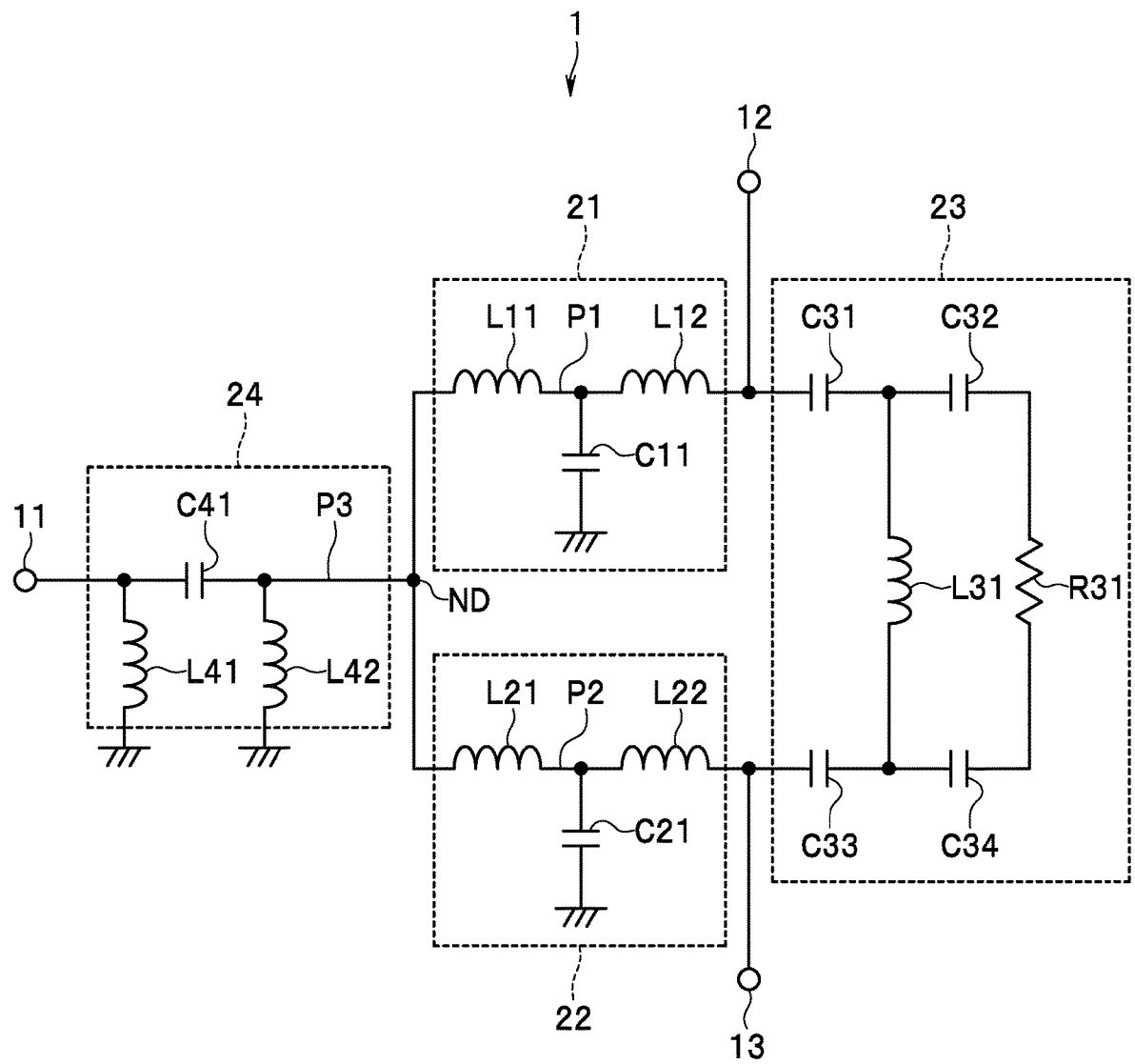
FIG. 2 is a circuit diagram showing a circuit configuration of the electronic component according to the first embodiment of the present disclosure.

Embodiments of the present disclosure will be described in detail below with reference to the drawings. First, a configuration of an electronic component according to a first embodiment of the present disclosure will be described with reference to FIGS. 1 and 2. FIG. 1 is a block diagram showing the configuration of the electronic component according to the present embodiment. FIG. 2 is a circuit diagram showing a circuit configuration of the electronic component according to the present embodiment. An electronic component 1 according to the present embodiment includes a first input/output port 11, a second input/output port 12, a third input/output port 13, a first circuit 21, a second circuit 22, and a third circuit 23.

The first circuit 21 is provided between the first input/output port 11 and the second input/output port 12 in a circuit configuration. The second circuit 22 is provided between the first input/output port 11 and the third input/output port 13 in the circuit configuration. The third circuit 23 is provided between the second input/output port 12 and the third input/output port 13 in the circuit configuration. The first and second circuits 21 and 22 are each connected to a ground. In the present application, the expression "in the (a) circuit configuration" is used to indicate not layout in physical configuration but layout in the circuit diagram.

In the present embodiment in particular, the electronic component 1 is a divider and combiner that divides or combines a plurality of signals. The first and second circuits 21 and 22 are characteristic impedance converter circuits used to adjust impedance of each of the first to third input/output ports 11 to 13 to a prescribed value (for example, 50Ω).

The third circuit 23 is a signal absorbing circuit in which when a signal is input to one of the second input/output port 12 and the third input/output port 13, the signal flowing to the other of the second input/output port 12 and the third input/output port 13 is absorbed. In the present embodiment, the third circuit 23 has a circuit configuration where a complex conjugate relationship is made with each of the first and second circuits 21 and 22. The circuit configuration where a complex conjugate relationship is made with each of the first and second circuits 21 and 22 is a circuit configuration where a sign of the imaginary part of the impedance of the third circuit 23 is opposite to the sign of the imaginary part of the impedance of each of the first and second circuits 21 and 22.

Here, a path connecting the first input/output port 11 and the second input/output port 12 is referred to as a first path P1, and a path connecting the first input/output port 11 and the third input/output port 13 is referred to as a second path P2. An element of the first circuit 21 provided in the first path P1 is referred to as a series element of the first circuit 21, and an element of the first circuit 21 provided between the first path P1 and the ground is referred to as a parallel element of the first circuit 21. An element of the second circuit 22 provided in the second path P2 is referred to as a series element of the second circuit 22, and an element of the second circuit 22 provided between the second path P2 and the ground is referred to as a parallel element of the second circuit 22.

In the present embodiment, elements constituting the third circuit 23 are provided in the third circuit 23 so as to be in a complex conjugate relationship with the elements constituting each of the first and second circuits 21 and 22 as shown below. The third circuit 23 includes the elements that are opposite in a sign of the imaginary part of the impedance to the series elements of the first circuit 21, and these elements are connected in series with the series elements of the first circuit 21. The third circuit 23 also includes the elements that are opposite in the sign of the imaginary part of the impedance to the series elements of the second circuit 22, and these elements are connected in series with the series elements of the second circuit 22. The third circuit 23 includes the element that is opposite in the sign of the imaginary part of the impedance to the parallel element of each of the first and second circuits 21 and 22, and the element is provided between the element that is opposite in the sign of the imaginary part of the impedance to the series elements of the first circuit 21 and the element that is opposite in the sign of the imaginary part of the impedance to the series elements of the second circuit 22.

An inductor and a capacitor are elements that are opposite in the sign of the imaginary part of the impedance to each other. Each of the first to third circuits 21 to 23 includes at least one inductor and at least one capacitor. The at least one inductor in the third circuit 23 is provided in the third circuit so as to be in a complex conjugate relationship with the at least one capacitor in each of the first and second circuits 21 and 22. The at least one capacitor in the third circuit 23 is provided in the third circuit 23 so as to be in a complex conjugate relationship with the at least one inductor in each of the first and second circuits 21 and 22.

In the present embodiment, in particular, the first circuit 21 includes at least one first inductor provided in the first path P1 and at least one first capacitor provided between the first path P1 and the ground. The second circuit 22 includes at least one second inductor provided in the second path P2 and at least one second capacitor provided between the second path P2 and the ground.

The third circuit 23 includes at least one third capacitor connected in series with the at least one first inductor, at least one fourth capacitor connected in series with the at least one second inductor, and at least one third inductor. The third circuit 23 further includes a resistor element R31. The at least one third inductor and the resistor element R31 are provided in parallel between the at least one third capacitor and the at least one fourth capacitor. The third circuit 23 has a circuit configuration that is symmetrical about the at least one third inductor and the resistor element R31.

The electronic component 1 further includes a matching circuit 24. The matching circuit 24 is provided between the first input/output port 11 and the first and second circuits 21 and 22 in the circuit configuration. The matching circuit 24 is connected to the ground. The first circuit 21, the second circuit 22, and the matching circuit 24 branch from one node ND.

The matching circuit 24 includes at least one matching circuit capacitor provided in a third path P3 that connects the first input/output port 11 and the node ND, and at least one matching circuit inductor provided between the third path P3 and the ground. The first path P1 connects the first input/output port 11 and the second input/output port 12 via the third path P3. The second path P2 connects the first input/output port 11 and the third input/output port 13 via the third path P3.

A specific circuit configuration of the electronic component 1 according to the present embodiment will be described below with reference to FIG. 2. As shown in FIG. 2, the first circuit 21 includes two first inductors L11 and L12, and one first capacitor C11. One end of the first inductor L11 is connected to the node ND. The other end of the first inductor L11 is connected to one end of the first inductor L12 and one end of the first capacitor C11. The other end of the first inductor L12 is connected to the second input/output port 12. The other end of the first capacitor C11 is connected to the ground.

The second circuit 22 is similar in configuration to the first circuit 21. Specifically, the second circuit 22 includes two second inductors L21 and L22, and one second capacitor C21. One end of the second inductor L21 is connected to the node ND. The other end of the second inductor L21 is connected to one end of the second inductor L22 and one end of the second capacitor C21. The other end of the second inductor L22 is connected to the third input/output port 13. The other end of the second capacitor C21 is connected to the ground.

The third circuit 23 includes two third capacitors C31 and C32 that are connected in series with the first inductors L11 and L12, two fourth capacitors C33 and C34 that are connected in series with the second inductors L21 and L22, and one third inductor L31. One end of the third capacitor C31 is connected to the other end of the first inductor L12 and the second input/output port 12. The other end of the third capacitor C31 is connected to one end of the third capacitor C32 and one end of the third inductor L31. One end of the fourth capacitor C33 is connected to the other end of the second inductor L22 and the third input/output port 13. The other end of the fourth capacitor C33 is connected to one end of the fourth capacitor C34 and the other end of the third inductor L31.

The other end of the third capacitor C32 is connected to one end of the resistor element R31. The other end of the fourth capacitor C34 is connected to the other end of the resistor element R31. The impedance of the third circuit 23 is adjusted to match characteristic impedance of the second input/output port 12 or the characteristic impedance of the third input/output port 13. Specifically, a resistance value of the resistor element R31 is adjusted so that the third circuit 23 is matched with the second input/output port 12 or the third input/output port 13.

The matching circuit 24 includes one matching circuit capacitor C41 and two matching circuit inductors L41 and L42. One end of the matching circuit capacitor C41 is connected to the first input/output port 11 and one end of the matching circuit inductor L41. The other end of the matching circuit capacitor C41 is connected to the node ND and one end of the matching circuit inductor C42. The other ends of the matching circuit inductors L41 and L42 are each connected to the ground.

Next, a communication apparatus according to the present embodiment will be described. A communication apparatus 100 according to the present embodiment includes the electronic component 1 according to the present embodiment and at least one antenna that is connected to the electronic component 1.

Figure 3:
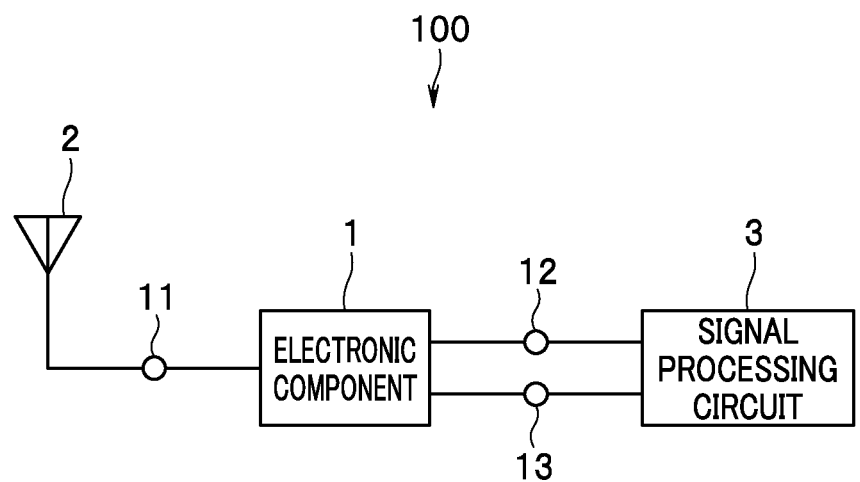
FIG. 3 is a block diagram showing a first example of a communication apparatus according to the first embodiment of the present disclosure.

First, a first example of the communication apparatus 100 will be described with reference to FIG. 3. In the first example, the communication apparatus 100 includes the electronic component 1, one antenna 2, and a signal processing circuit 3. The antenna 2 is connected to the first input/output port 11 of the electronic component 1. The signal processing circuit 3 is connected to the second and third input/output ports 12 and 13 of the electronic component 1.

The signal processing circuit 3 is a circuit to implement prescribed functions of the communication apparatus 100. The signal processing circuit 3 may include at least one of an application-specific integrated circuit (ASIC), a digital signal processor (DSP), and a microcomputer. The signal processing circuit 3 may further include an analog circuit.

In the first example, the electronic component 1 can divide a reception signal received by the antenna 2 to the second input/output port 12 and the third input/output port 13. The two divided reception signals are input to the signal processing circuit 3 via the second and third input/output ports 12 and 13, and prescribed processing is performed on the signals. In the first example, the electronic component 1 can also combine two transmission signals output from the signal processing circuit 3. The resultant signal is supplied to the antenna 2 via the first input/output port 11.

Figure 4:
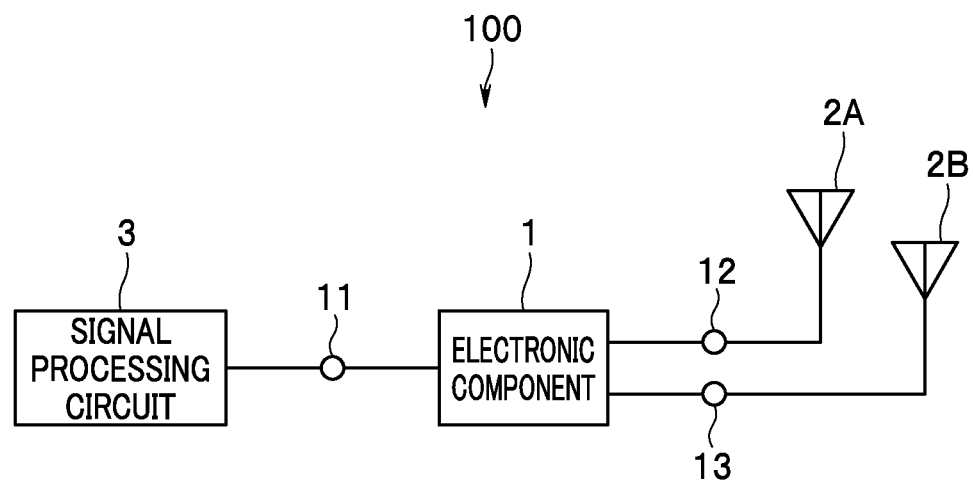
FIG. 4 is a block diagram showing a second example of the communication apparatus according to the first embodiment of the present disclosure.

Next, a second example of the communication apparatus 100 will be described with reference to FIG. 4. In the second example, the communication apparatus 100 includes the electronic component 1, two antennas 2A and 2B, and the signal processing circuit 3. The antenna 2A is connected to the second input/output port 12 of the electronic component 1. The antenna 2B is connected to the third input/output port 13 of the electronic component 1. The signal processing circuit 3 is connected to the first input/output port 11 of the electronic component 1.

In the second example, the electronic component 1 can combine the two reception signals received by the antennas 2A and 2B. The resultant signal is input into the signal processing circuit 3 via the first input/output port 11, and prescribed processing is performed on the signal. In the second example, the electronic component 1 can divide a transmission signal output from the signal processing circuit 3 to the second input/output port 12 and the third input/output port 13. The divided two transmission signals are supplied to the antennas 2A and 2B via the second and third input/output ports 12 and 13.

Figure 5:
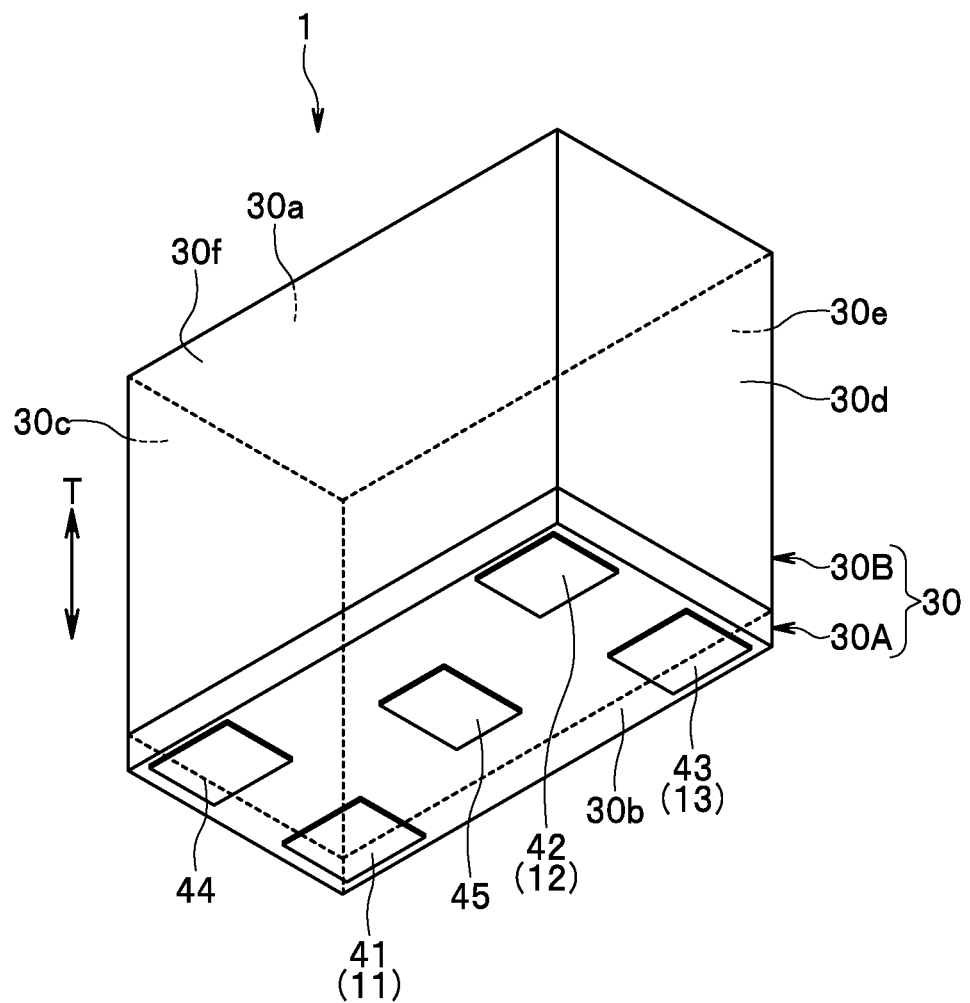
FIG. 5 is a perspective view showing the electronic component according to the first embodiment of the present disclosure.
Figure 6:
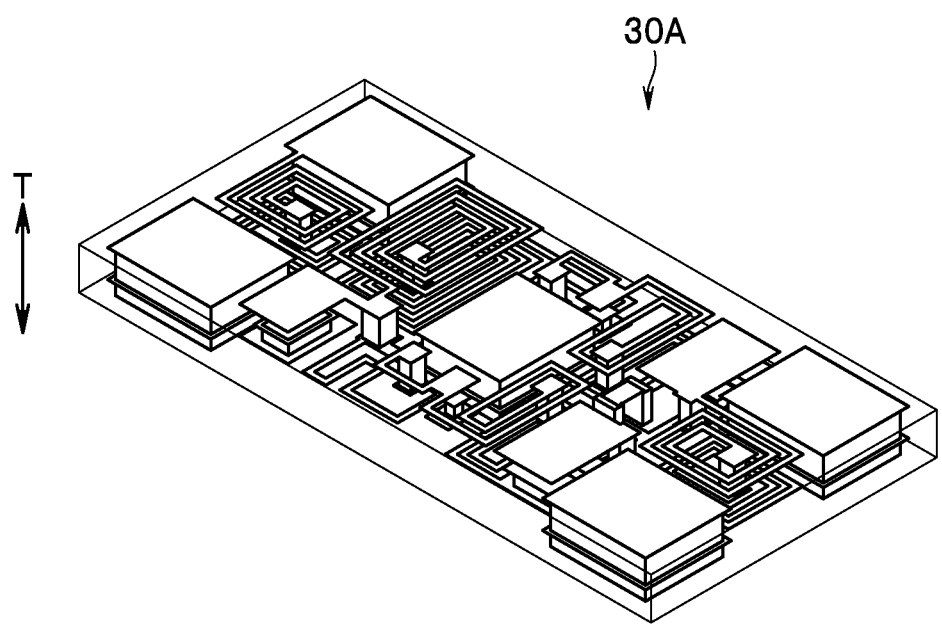
FIG. 6 is a perspective view showing the inside of a main body portion of the electronic component shown in FIG. 5.
Figure 7:
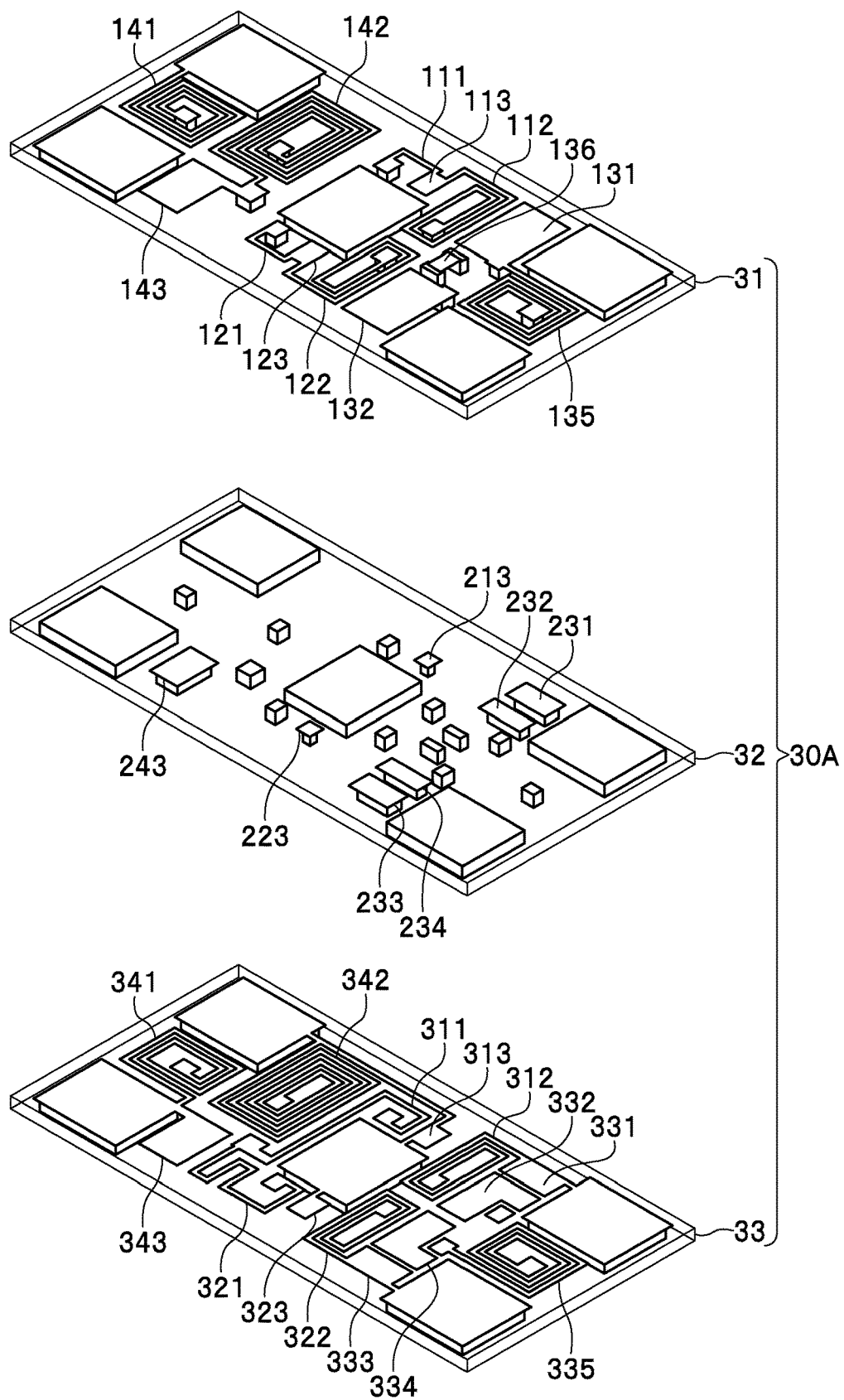
FIG. 7 is a perspective view showing dielectric layers, conductor layers, and through holes in the main body portion of the electronic component shown in FIG. 5.

Next, an example of the structure of the electronic component 1 will be described with reference to FIGS. 5 to 7. FIG. 5 is a perspective view showing the electronic component 1. FIG. 6 is a perspective view showing the inside of a main body portion of the electronic component 1. FIG. 7 is a perspective view showing dielectric layers, conductor layers, and through holes in the main body portion of the electronic component 1. The electronic component 1 further includes a stack 30 to integrate the first to third input/output ports 11 to 13, the first to third circuits 21 to 23, and the matching circuit 24. As will be discussed in more detail later, the stack 30 includes a plurality of dielectric layers stacked together and a plurality of conductor layers.

The stack 30 has a rectangular parallelepiped shape. The stack 30 has a top surface 30a, a bottom surface 30b, and four side surfaces 30c to 30f that constitute an outer peripheral portion of the stack 30. The top surface 30a and the bottom surface 30b are opposite to each other, the side surfaces 30c and 30d are also opposite to each other, and the side surfaces 30e and 30f are also opposite to each other. The side surfaces 30c to 30f are perpendicular to the top surface 30a and the bottom surface 30b. In the stack 30, the direction perpendicular to the top surface 30a and the bottom surface 30b is a stacking direction of the plurality of dielectric layers and the plurality of conductor layers. In FIGS. 5 and 6, the stacking direction is expressed by arrows with a symbol T. The top surface 30a and the bottom surface 30b are located at both ends of the stacking direction T.

The stack 30 includes a main body portion 30A that constitutes a main part of the electronic component 1, and a support substrate 30B that supports the main body portion 30A. The main body portion 30A and the support substrate 30B are arranged in the stacking direction T. The main body portion 30A includes a top surface, a bottom surface, and four side surfaces that constitute an outer peripheral portion of the main body portion 30A. The support substrate 30B includes a top surface, a bottom surface, and four side surfaces that constitute an outer peripheral portion of the support substrate 30B. The top surface of the main body portion 30A and the bottom surface of the support substrate 30B face each other. The bottom surface of the main body portion 30A constitutes the bottom surface 30b of the stack 30. The top surface of the support substrate 30B constitutes the top surface 30a of the stack 30.

The electronic component 1 further includes first to fifth terminals 41, 42, 43, 44, and 45 provided in the main body portion 30A. As shown in FIG. 5, the first to fifth terminals 41 to 45 are disposed on the bottom surface of the main body portion 30A, that is, the bottom surface 30b of the stack 30. The first terminal 41 corresponds to the first input/output port 11. The second terminal 42 corresponds to the second input/output port 12. The third terminal 43 corresponds to the third input/output port 13. The fourth and fifth terminals 44 and 45 are each connected to the ground.

Next, the main body portion 30A will be described in detail with reference to FIGS. 7 to 11. The main body portion 30A includes three dielectric layers that are stacked together. These three dielectric layers are referred to as first to third dielectric layers in order from the top surface side of the main body portion 30A. The first to third dielectric layers are denoted by reference numerals 31 to 33. In FIG. 7, the first to third dielectric layers 31 to 33 are depicted so as to be apart from each other along the stacking direction T (see FIGS. 5 and 6).

Figure 8:
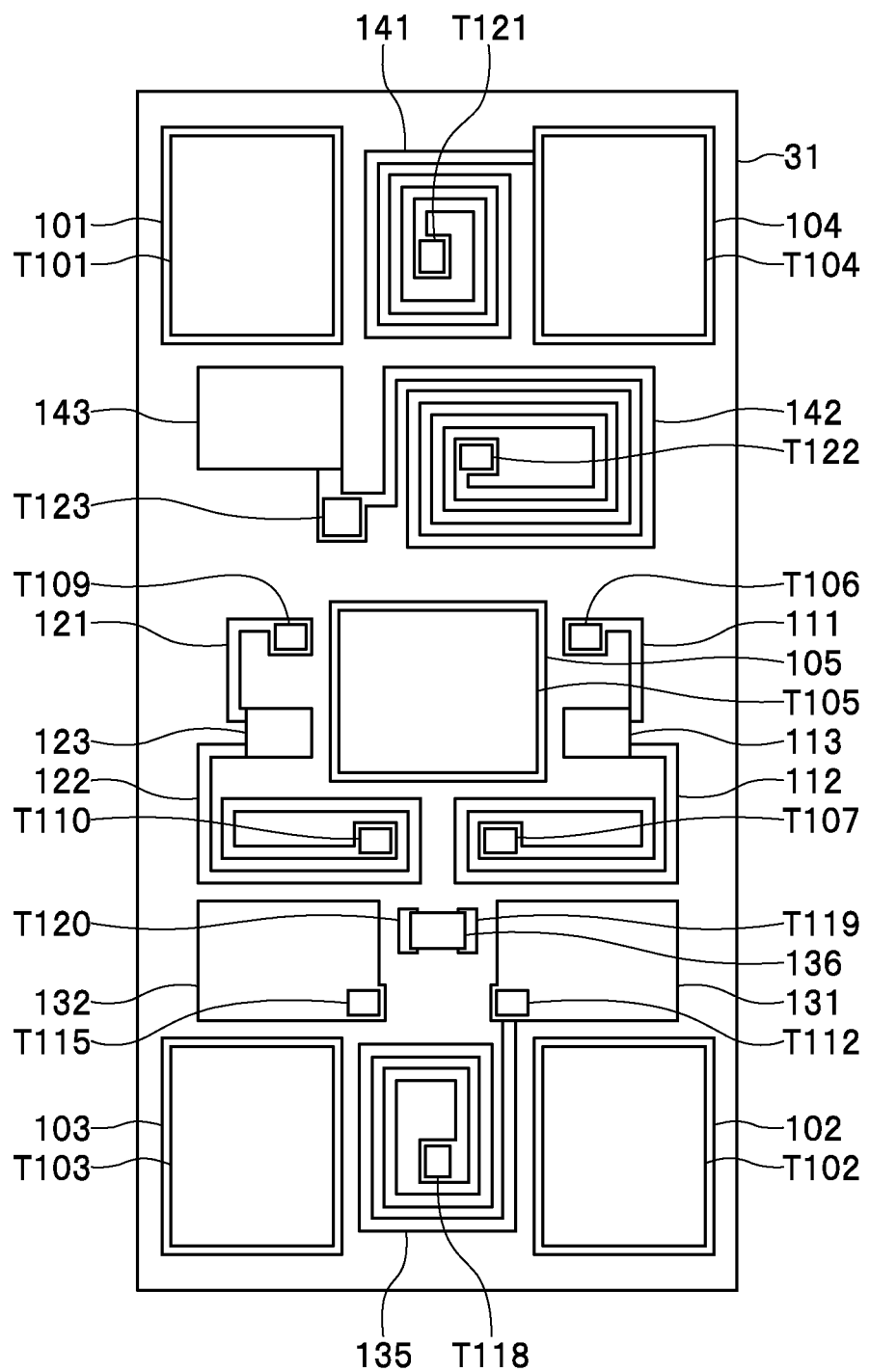
FIG. 8 is a plan view showing a patterned surface of a first dielectric layer in the main body portion of the electronic component shown in FIG. 5.
Figure 9:
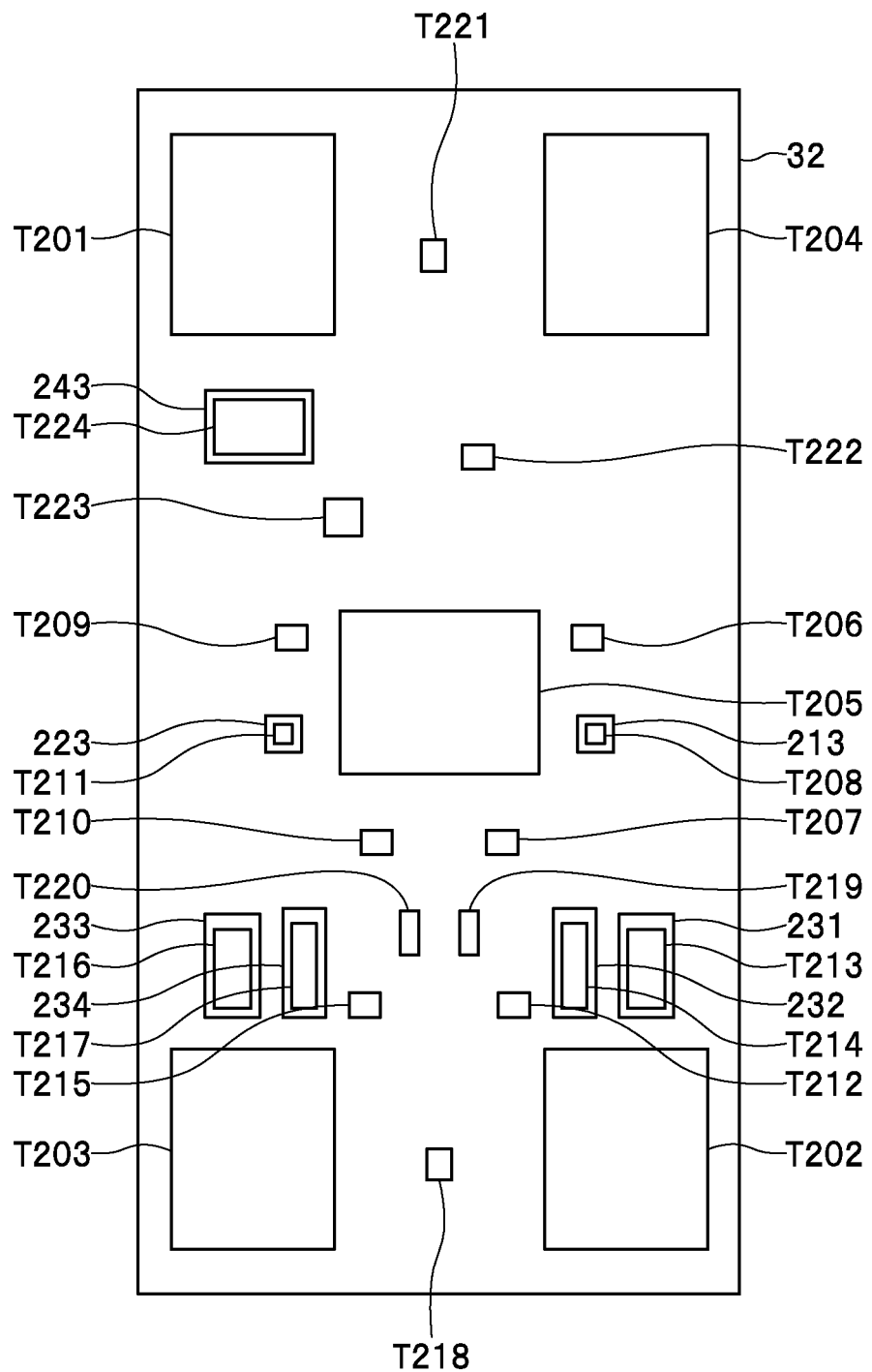
FIG. 9 is a plan view showing the patterned surface of a second dielectric layer in the main body portion of the electronic component shown in FIG. 5.
Figure 10:
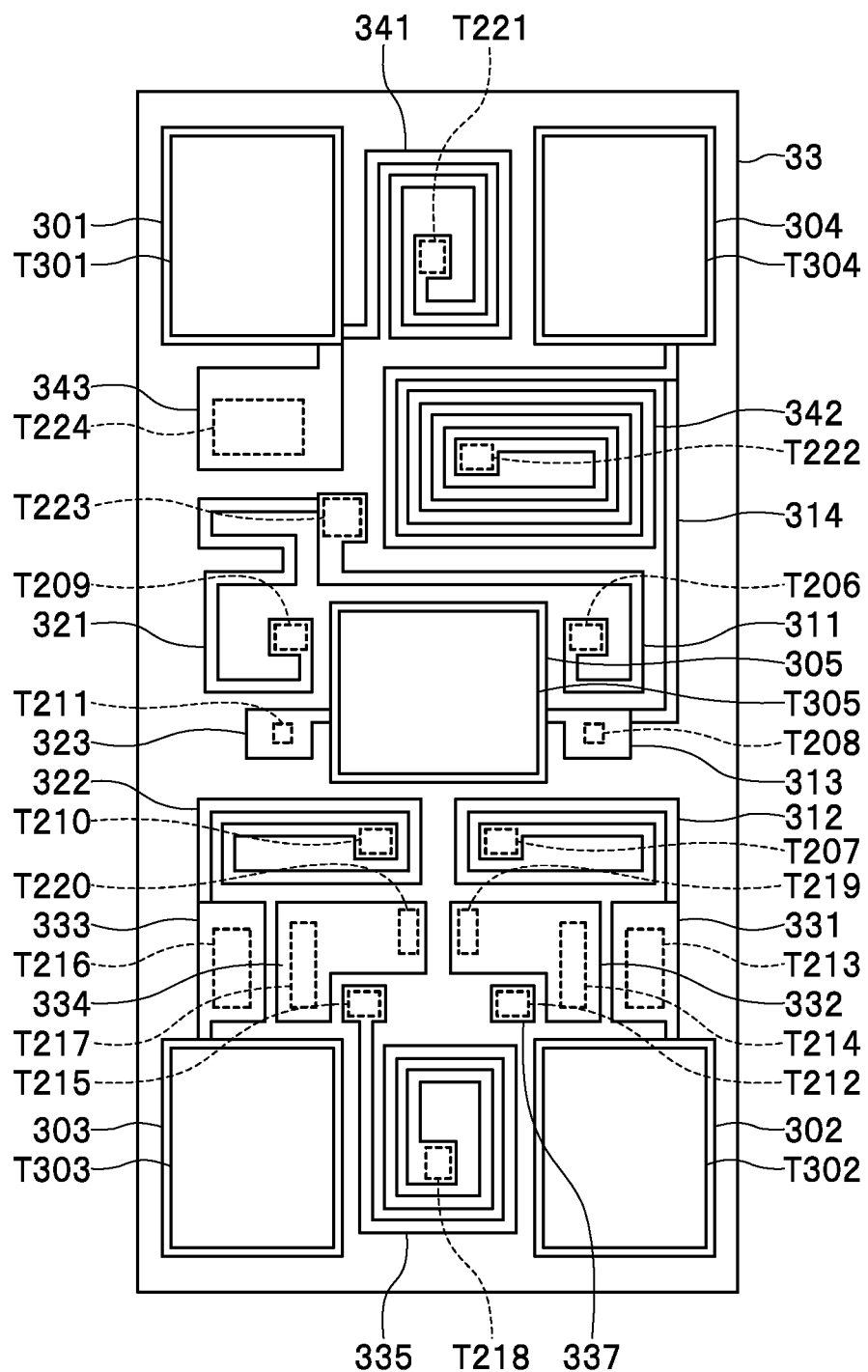
FIG. 10 is a plan view showing the patterned surface of a third dielectric layer in the main body portion of the electronic component shown in FIG. 5.
Figure 11:
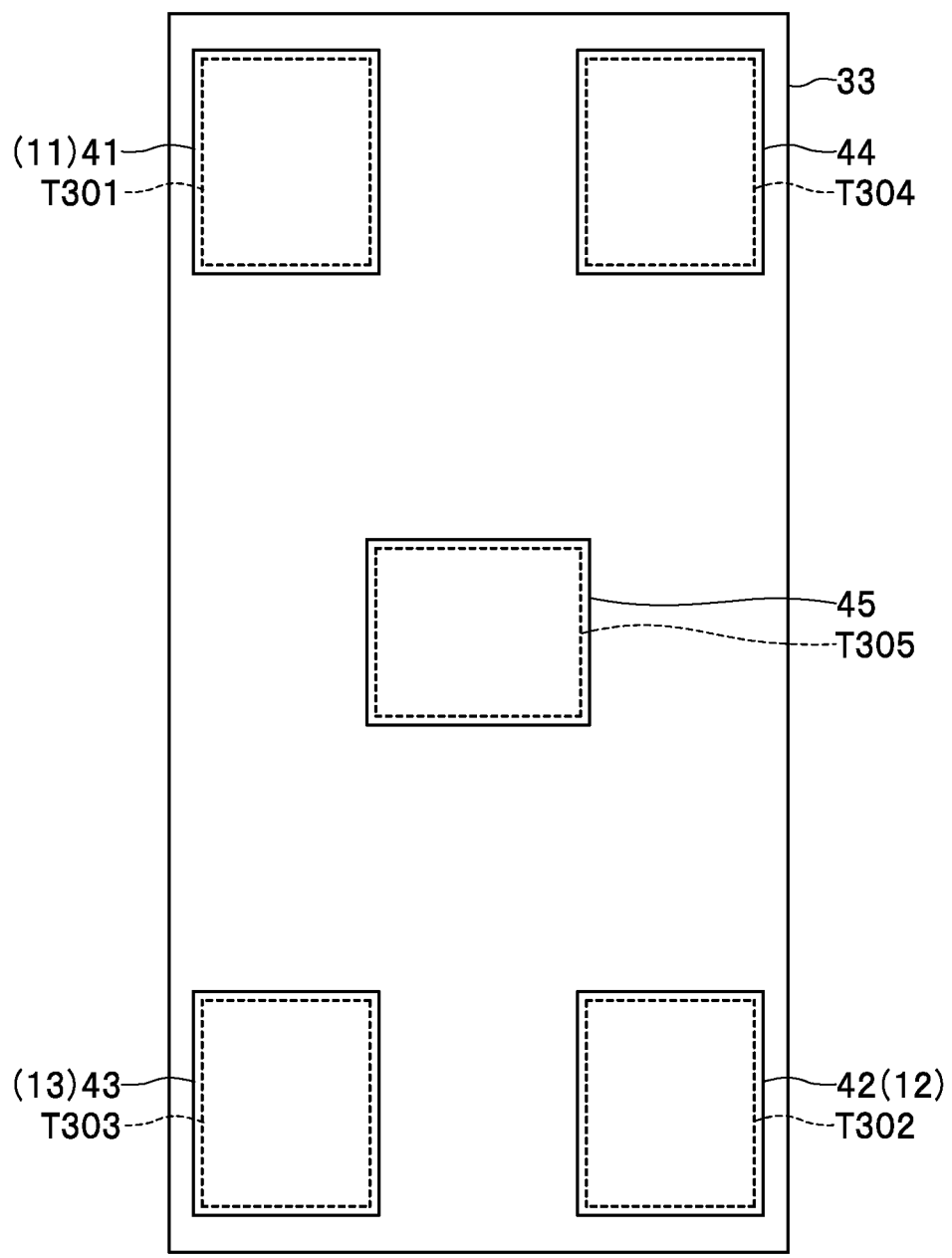
FIG. 11 is a plan view showing a terminal formation surface of the third dielectric layer in the main body portion of the electronic component shown in FIG. 5.

Each of the first to third dielectric layers 31 to 33 has a patterned surface. The third dielectric layer 33 has a terminal formation surface located on the opposite side to the patterned surface. FIG. 8 shows the patterned surface of the first dielectric layer 31. FIG. 9 shows the patterned surface of the second dielectric layer 32. FIG. 10 shows the patterned surface of the third dielectric layer 33. FIG. 11 shows a terminal formation surface of the third dielectric layer 33.

As shown in FIG. 8, conductor layers 101, 102, 103, 104 and 105, conductor layers 111, 112 and 113 for the first circuit 21, conductor layers 121, 122 and 123 for the second circuit 22, conductor layers 131, 132 and 135 for the third circuit 23, a conductor layer 136 for the resistor element, and conductor layers 141, 142 and 143 for the matching circuit 24 are formed on the patterned surface of the first dielectric layer 31.

Each of the conductor layers 111, 112, 121, 122, 135, 136, 141, and 142 has a first end and a second end located opposite to each other. The first end of each of the conductor layers 111 and 112 is connected to the conductor layer 113. The first end of each of the conductor layers 121 and 122 is connected to the conductor layer 123. The first end of the conductor layer 135 is connected to the conductor layer 131. The first end of the conductor layer 141 is connected to the conductor layer 104. The first end of the conductor layer 142 is connected to the conductor layer 143.

Through holes T101, T102, T103, T104, T105, T106, T107, T109, T110, T112, T115, T118, T119, T120, T121, T122, and T123 are also formed in the dielectric layer 31. The through holes T101 to T105 are connected to the conductor layers 101 to 105, respectively.

The through hole T106 is connected to a portion of the conductor layer 111 near the second end thereof. The through hole T107 is connected to a portion of the conductor layer 112 near the second end thereof. The through hole T109 is connected to a portion of the conductor layer 121 near the second end thereof. The through hole T110 is connected to a portion of the conductor layer 122 near the second end thereof. The through hole T112 is connected to the conductor layer 131. The through holes T115 is connected to the conductor layer 132. The through hole T118 is connected to a portion of the conductor layer 135 near the second end thereof. The through hole T119 is connected to a portion of the conductor layer 136 near the first end thereof. The through hole T120 is connected to a portion of the conductor layer 136 near the second end thereof. The through hole T121 is connected to a portion of the conductor layer 141 near the second end thereof. The through hole T122 is connected to a portion of the conductor layer 142 near the second end thereof. The through hole T123 is connected to a portion of the conductor layer 142 near the first end thereof.

As shown in FIG. 9, a conductor layer 213 for the first circuit 21, a conductor layer 223 for the second circuit 22, conductor layers 231, 232, 233, and 234 for the third circuit 23, and a conductor layer 243 for the matching circuit 24 are formed on the patterned surface of the second dielectric layer 32.

Through holes T201, T202, T203, T204, T205, T206, T207, T208, T209, T210, T211, T212, T213, T214, T215, T216, T217, T218, T219, T220, T221, T222, T223, and T224 are also formed in the dielectric layer 32. The through holes T201 to T207, T209, T210, T212, T215, and T218 to T223 are connected to the through holes T101 to T107, T109, T110, T112, T115, and T118 to T123 formed in the first dielectric layer 31, respectively.

The through hole T208 is connected to the conductor layer 213. The through hole T211 is connected to the conductor layer 223. The through hole T213 is connected to the conductor layer 231. The through hole T214 is connected to the conductor layer 232. The through hole T216 is connected to the conductor layer 233. The through hole T217 is connected to the conductor layer 234. The through hole T224 is connected to the conductor layer 243.

As shown in FIG. 10, conductor layers 301, 302, 303, 304 and 305, conductor layers 311, 312 and 313 for the first circuit 21, a conductor layer 314, conductor layers 321, 322 and 323 for the second circuit 22, conductor layers 331, 332, 333, 334 and 335 for the third circuit 23, a conductor layer 337, and conductor layers 341, 342 and 343 for the matching circuit 24 are formed on the patterned surface of the third dielectric layer 33. The conductor layers 313 and 323 are connected to the conductor layer 305. The conductor layer 331 is connected to the conductor layer 302. The conductor layer 333 is connected to the conductor layer 303. The conductor layer 343 is connected to the conductor layer 301.

Each of the conductor layers 311, 312, 314, 321, 322, 335, 341, and 342 has a first end and a second end located opposite to each other. The first end of the conductor layer 311 is connected to the first end of the conductor layer 321. The first end of the conductor layer 312 is connected to the conductor layer 331. The first end of the conductor layer 314 is connected to the conductor layer 313. The second end of the conductor layer 314 is connected to a portion of the conductor layer 342 near the first end thereof. The first end of the conductor layer 322 is connected to the conductor layer 333. The first end of the conductor layer 341 is connected to the conductor layer 301. The first end of the conductor layer 342 is connected to the conductor layer 304.

The through holes T201 to T205 formed in the second dielectric layer 32 are connected to the conductor layers 301 to 305, respectively. In FIG. 10, dashed lines indicate connection positions of the through holes T206 to T224 formed in the second dielectric layer 32. The through hole T206 is connected to a portion of the conductor layer 311 near the second end thereof. The through hole T207 is connected to a portion of the conductor layer 312 near the second end thereof. The through hole T208 is connected to the conductor layer 313. The through hole T209 is connected to a portion of the conductor layer 321 near the second end thereof. The through hole T210 is connected to a portion of the conductor layer 322 near the second end thereof. The through hole T211 is connected to the conductor layer 323.

The through hole T212 is connected to the conductor layer 337. The through hole T213 is connected to the conductor layer 331. The through holes T214 and T219 are connected to the conductor layer 332 at respective different positions. The through hole T215 is connected to a portion of the conductor layer 335 near the first end thereof. The through holes T216 is connected to the conductor layer 333. The through holes T217 and T220 are connected to the conductor layer 334 at respective different positions. The through hole T218 is connected to a portion of the conductor layer 335 near the second end thereof. The through hole T221 is connected to a portion of the conductor layer 341 near the second end thereof. The through hole T222 is connected to a portion of the conductor layer 342 near the second end thereof. The through hole T223 is connected to a portion of the conductor layer 311 near the second end thereof. The through holes T224 is connected to the conductor layer 343.

In the dielectric layer 33, through holes T301, T302, T303, T304, and T305 are formed. The through holes T301 to T305 are connected to the conductor layers 301 to 305, respectively.

As shown in FIG. 11, the first to fifth terminals 41 to 45 are formed on the terminal formation surface of the third dielectric layer 33. In FIG. 11, dashed lines indicate connection positions of the through holes T301 to T305. The through holes T301 to T305 are connected to the first to fifth terminals 41 to 45, respectively.

The stack 30 shown in FIG. 5 is formed by stacking the first to third dielectric layers 31 to 33 on the bottom surface of the support substrate 30B such that the terminal formation surface of the third dielectric layer 33 serves as the bottom surface 30$b$ of the stack 30. The electronic component 1 may include an insulating layer which is not shown, the insulating layer being interposed between the first dielectric layer 31 of the main body portion 30A and the support substrate 30B.

A correspondence between the components of the electronic component 1 and the components inside the main body portion 30A shown in FIGS. 7 to 11 will now be described. First, the first circuit 21 will be described. The first inductor L11 is formed of the conductor layers 111 and 311 that are connected to each other through the through holes T106 and T206. The first inductor L12 is formed of the conductor layers 112 and 312 that are connected to each other through the through holes T107 and T207. The first capacitor C11 is formed of the conductor layers 113 and 213, and the dielectric layer 31 between the conductor layers 113 and 213.

Next, the second circuit 22 will be described. The second inductor L21 is formed of the conductor layers 121 and 321 that are connected to each other through the through holes T109 and T209. The second inductor L22 is formed of the conductor layers 122 and 322 that are connected to each other through the through holes T110 and T210. The second capacitor C21 is formed of the conductor layers 123 and 223, and the dielectric layer 31 between the conductor layers 123 and 223.

Next, the third circuit 23 will be described. The third capacitor C31 is formed of the conductor layers 131 and 231, and the dielectric layer 31 between the conductor layers 131 and 231. The third capacitor C32 is formed of the conductor layers 131 and 232, and the dielectric layer 31 between the conductor layers 131 and 232. The fourth capacitor C33 is formed of the conductor layers 132 and 233, and the dielectric layer 31 between the conductor layers 132 and 233. The fourth capacitor C34 is formed of the conductor layers 132 and 234, and the dielectric layer 31 between the conductor layers 132 and 234. The third inductor L31 is formed of the conductor layers 135 and 335 that are connected to each other through the through holes T118 and T228. The resistor element R31 is formed of the conductor layer 136.

Next, the matching circuit 24 will be described. The matching circuit capacitor C41 is formed of the conductor layers 143 and 243, and the dielectric layer 31 between the conductor layers 143 and 243. The matching circuit inductor L41 is formed of the conductor layers 141 and 341 that are connected to each other through the through holes T121 and T221. The matching circuit inductor L42 is formed of the conductor layers 142 and 342 that are connected to each other through the through holes T122 and T222.

Next, the operation and effects of the electronic component 1 and the communication apparatus 100 according to the present embodiment will be described. The electronic component 1 according to the present embodiment is a divider and combiner. One of the main parameters representing the characteristics of the divider and combiner is isolation. The definition of isolation for the electronic component 1 is as follows. Suppose that a high frequency signal of power P20 is input to the second input/output port 12 and a signal of power P23 is output from the third input/output port 13. Isolation I is defined by the following Eq. (1):

$$I=10 \log(P23/P20) \tag{1}$$

Isolation I is preferably −10 dB or less, for example. In the present embodiment, the third circuit 23 is provided between the second input/output port 12 and the third input/output port 13, the third circuit having a circuit configuration where a complex conjugate relationship is made with each of the first and second circuits 21 and 22. According to the present embodiment, the frequency band where the isolation I is a prescribed value or less can thus be widened.

With reference to the result of simulation, the effects of the present embodiment will be described below. First, a model of a first practical example and a model of a comparative example used in the simulation will be described. The model of the first practical example is a model of the electronic component 1 according to the present embodiment. The model of the comparative example is a model of an electronic component 51 of the comparative example, which is a typical Wilkinson-type divider and combiner.

Figure 12:
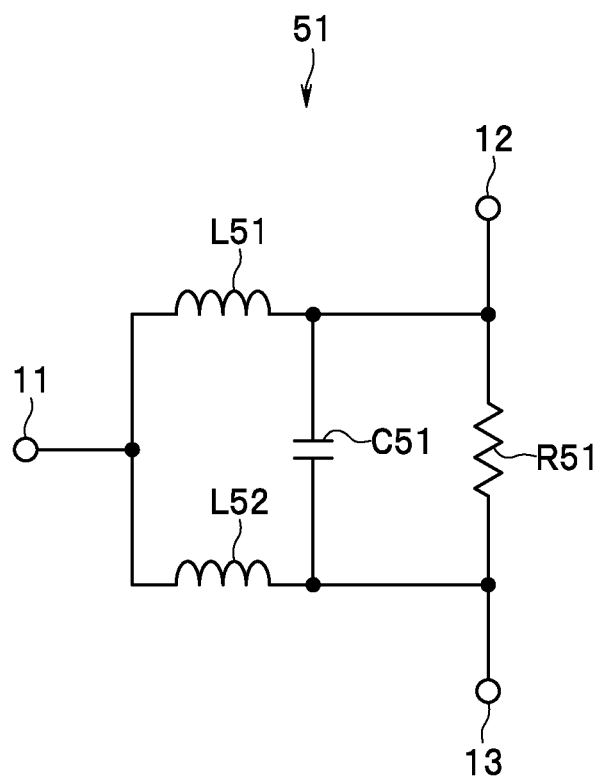
FIG. 12 is a circuit diagram showing a circuit configuration of an electronic component of a comparative example.

FIG. 12 is a circuit diagram showing the circuit configuration of the electronic component 51 of the comparative example. The electronic component 51 of the comparative example includes a first input/output port 11, a second input/output port 12, a third input/output port 13, inductors L51 and L52, a capacitor C51, and a resistor element R51. The inductor L51 is provided between the first input/output port 11 and the second input/output port 12. The inductor L52 is provided between the first input/output port 11 and the third input/output port 13. The resistor element R51 is provided between the second input/output port 12 and the third input/output port 13. One end of the capacitor C51 is connected to one end of each of the inductor L51 and the resistor element R51, while the other end of the capacitor C51 is connected to the other end of each of the inductor L51 and the resistor element R51.

In the simulation, the model of the first practical example and the model of the comparative example were each examined for isolation, insertion loss, reflection loss of the first input/output port 11, and reflection loss of the second input/output port 12. The definition of the insertion loss and the reflection loss for the electronic component 1 is as follows. Suppose that electric power of power P10 is input to the first input/output port 11, a signal of power P11 is reflected by the first input/output port 11, and a signal of power P12 is output from the second input/output port 12. In addition, suppose that a high frequency signal of power P20 is input to the second input/output port 12, a signal of power P22 is reflected by the second input/output port 12, and a signal of power P21 is output from the first input/output port 11. Insertion loss IL, reflection loss RL1 of the first input/output port 11, and reflection loss RL2 of the second input/output port 12 are defined by the following Eqs. (2) to (4), respectively:

$$IL=10 \log(P12/P10) \tag{2}$$

$$RL1=10 \log(P11/P10) \tag{3}$$

$$RL2=10 \log(P22/P20) \tag{4}$$

The definition of the isolation, the insertion loss, the reflection loss of the first input/output port 11, and the reflection loss of the second input/output port 12 in the electronic component 51 of the comparative example is the same as the definition of the isolation I, the insertion loss IL, the reflection loss RL1 of the first input/output port 11, and the reflection loss RL2 of the second input/output port 12 in the electronic component 1.

Figure 13:
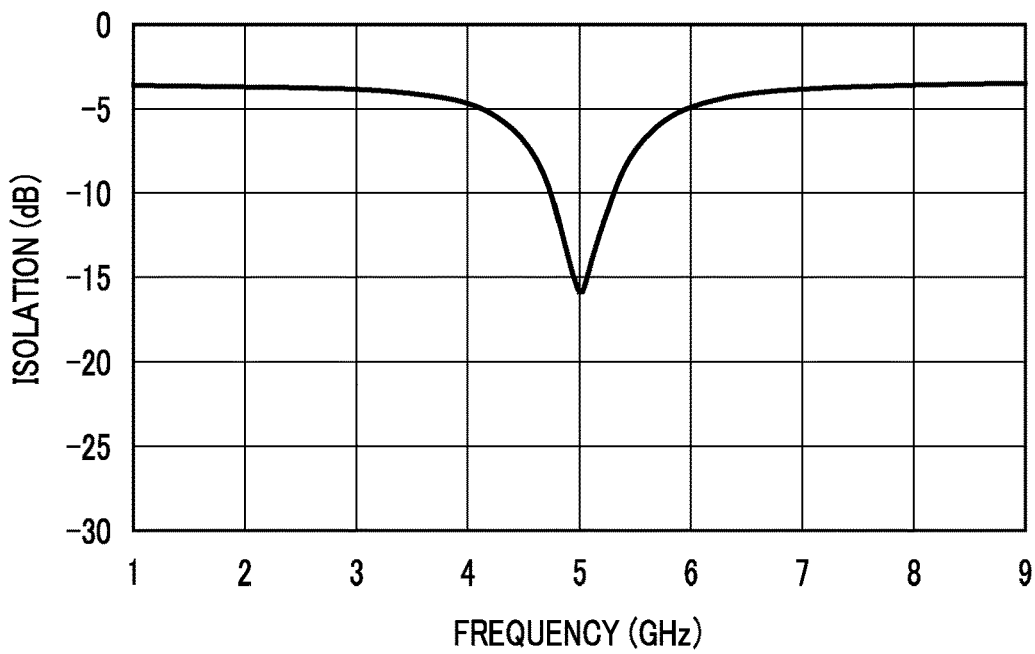
FIG. 13 is a characteristic chart showing a frequency characteristic of isolation in a model of the comparative example.

FIG. 13 is a characteristic chart showing a frequency characteristic of isolation in the model of the comparative example. In FIG. 13, the horizontal axis indicates the frequency, and the vertical axis indicates the isolation. In the model of the comparative example, the isolation was −10 dB or less in the frequency range of 4729 to 5304 MHz. Therefore, the bandwidth where the isolation was −10 dB or less was 575 MHz. The specific bandwidth, which was a value obtained by dividing the bandwidth by the center frequency, was 11.5%.

Figure 14:
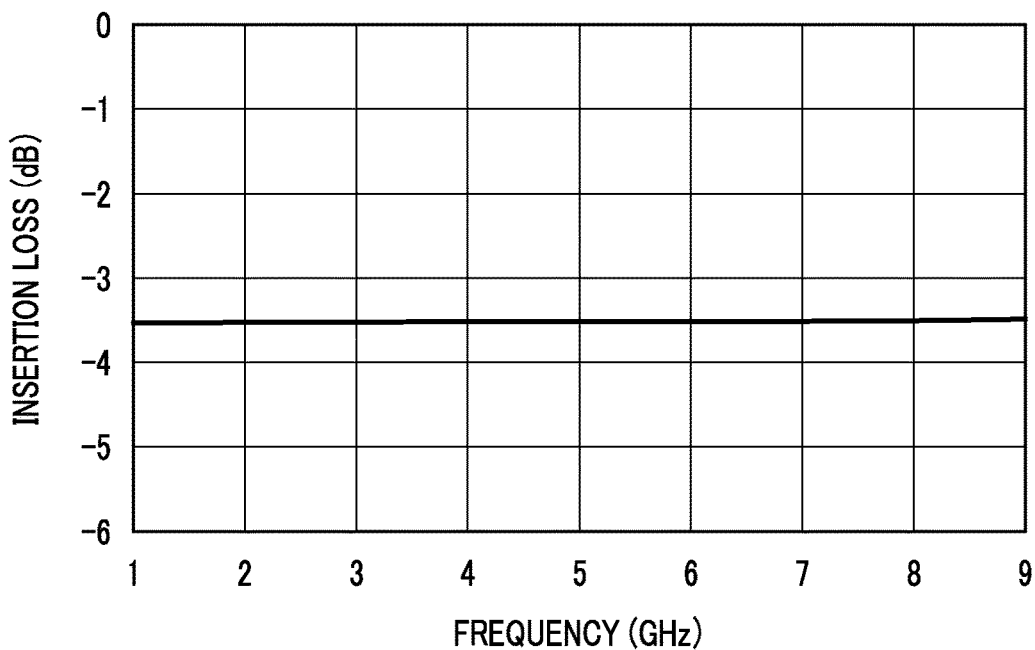
FIG. 14 is a characteristic chart showing the frequency characteristic of insertion loss in the model of the comparative example.

FIG. 14 is a characteristic chart showing the frequency characteristic of insertion loss in the model of the comparative example. In FIG. 14, the horizontal axis indicates the frequency, and the vertical axis indicates the insertion loss. When the insertion loss was expressed as −x (dB), the value of x was 3.54 at 5000 MHz.

Figure 15:
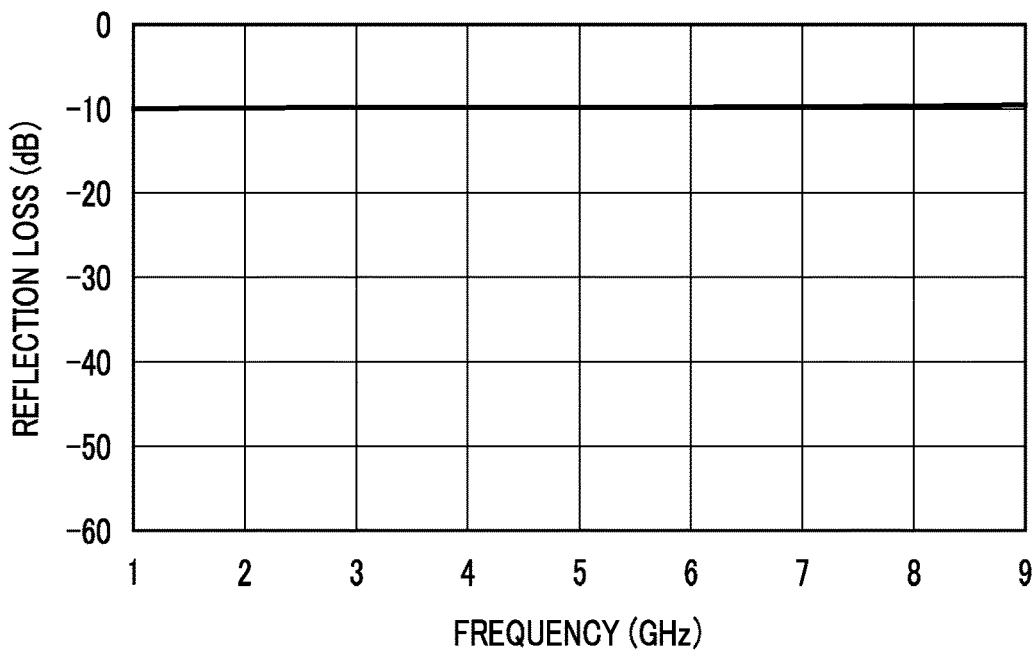
FIG. 15 is a characteristic chart showing the frequency characteristic of reflection loss in a first input/output terminal in the model of the comparative example.
Figure 16:
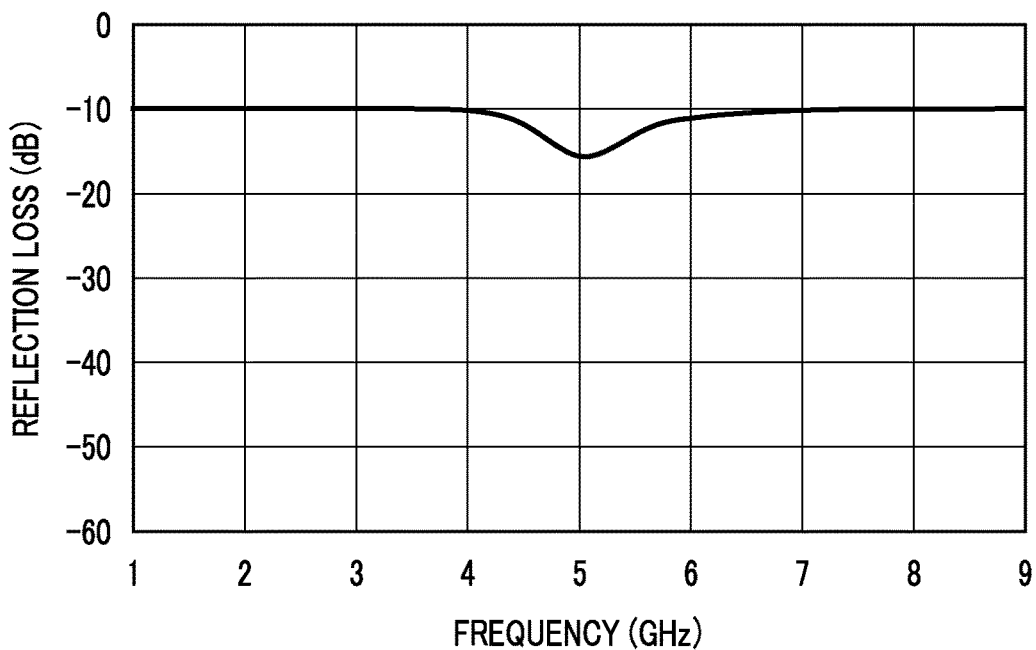
FIG. 16 is a characteristic chart showing the frequency characteristic of the reflection loss in a second input/output terminal in the model of the comparative example.

FIG. 15 is a characteristic chart showing the frequency characteristic of the reflection loss of the first input/output port 11 in the model of the comparative example. FIG. 16 is a characteristic chart showing the frequency characteristic of the reflection loss of the second input/output port 12 in the model of the comparative example. In each of FIGS. 15 and 16, the horizontal axis indicates the frequency, and the vertical axis indicates the reflection loss. When the reflection loss of the first input/output port 11 was expressed as −r1 (dB), the value of r1 was 9.56 at 2400 MHz, 9.52 at 5000 MHz, and 9.50 at 6000 MHz. When the reflection loss of the second input/output port 12 was expressed as −r2 (dB), the value of r2 was 9.66 at 2400 MHz, 15.28 at 5000 MHz, and 11.1 at 6000 MHz.

Figure 17:
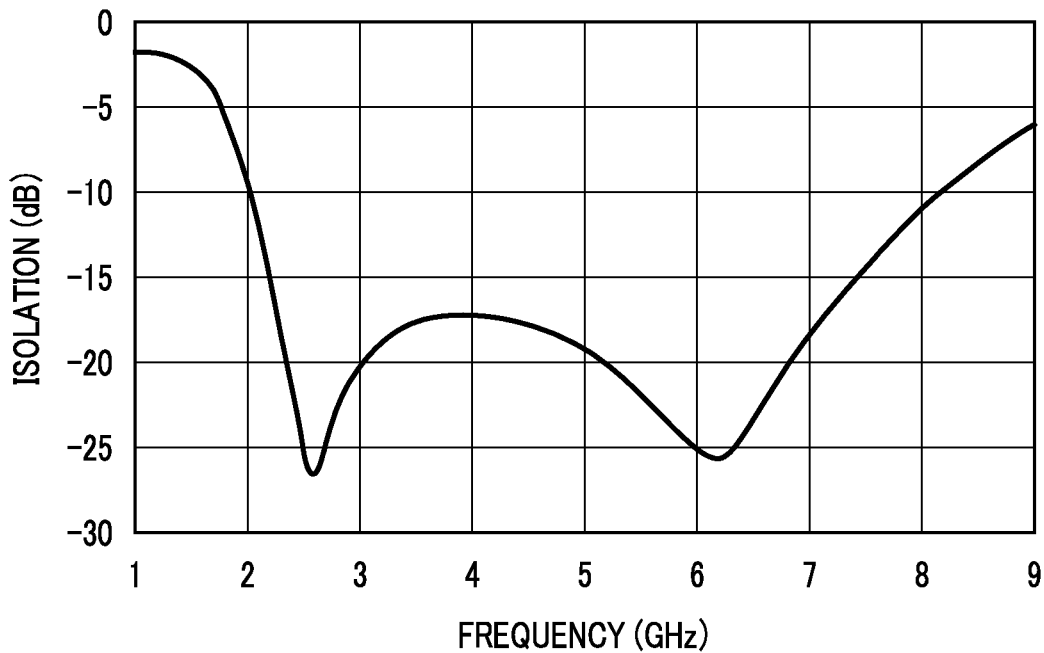
FIG. 17 is a characteristic chart showing the frequency characteristic of isolation in a model of a first practical example.

FIG. 17 is a characteristic chart showing the frequency characteristic of isolation in the model of the first practical example. In FIG. 17, the horizontal axis indicates the frequency, and the vertical axis indicates the isolation. In the model of the first practical example, the isolation was −10 dB or less in the frequency range of 2015 to 8228 MHz. Therefore, the bandwidth where the isolation was −10 dB or less was 6213 MHz. The specific bandwidth, which was a value obtained by dividing the bandwidth by the center frequency, was 121.3%.

Figure 18:
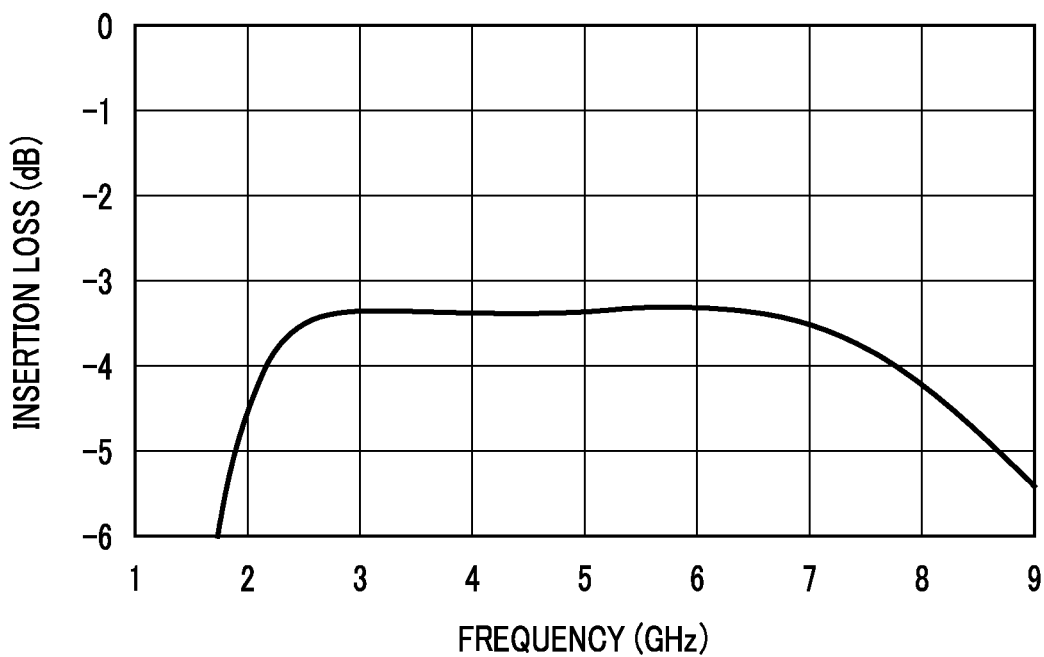
FIG. 18 is a characteristic chart showing the frequency characteristic of insertion loss in the model of the first practical example.

FIG. 18 is a characteristic chart showing the frequency characteristic of insertion loss in the model of the first practical example. In FIG. 18, the horizontal axis indicates the frequency, and the vertical axis indicates the insertion loss. When the insertion loss was expressed as −x (dB), the value of x was 3.52 at 2400 MHz, and 3.34 at 6000 MHz.

Figure 19:
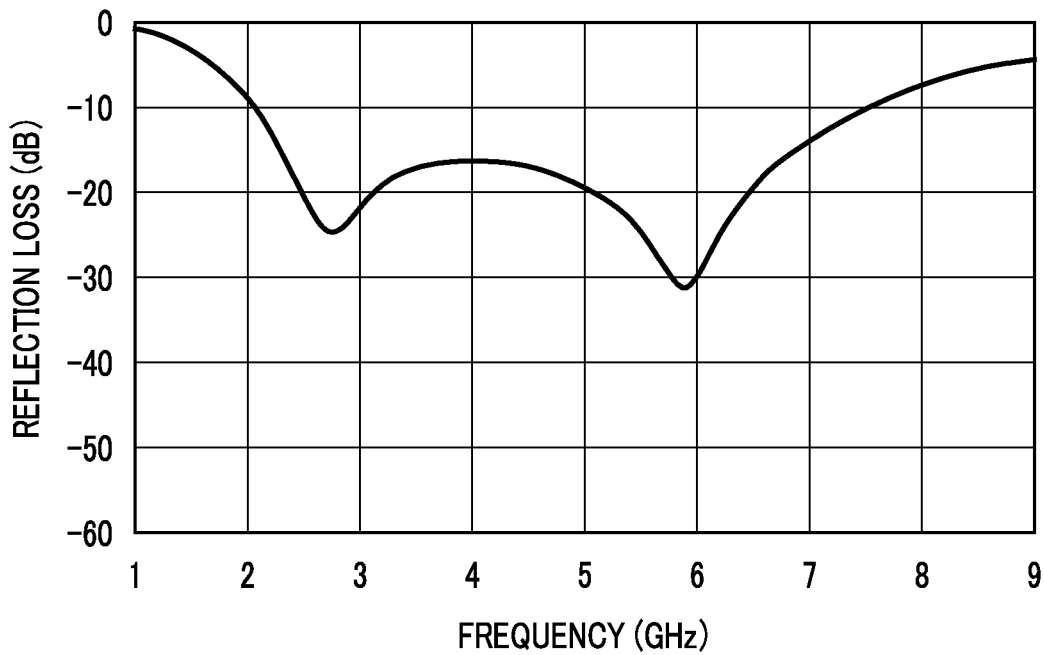
FIG. 19 is a characteristic chart showing the frequency characteristic of reflection loss in a first input/output terminal in the model of the first practical example.
Figure 20:
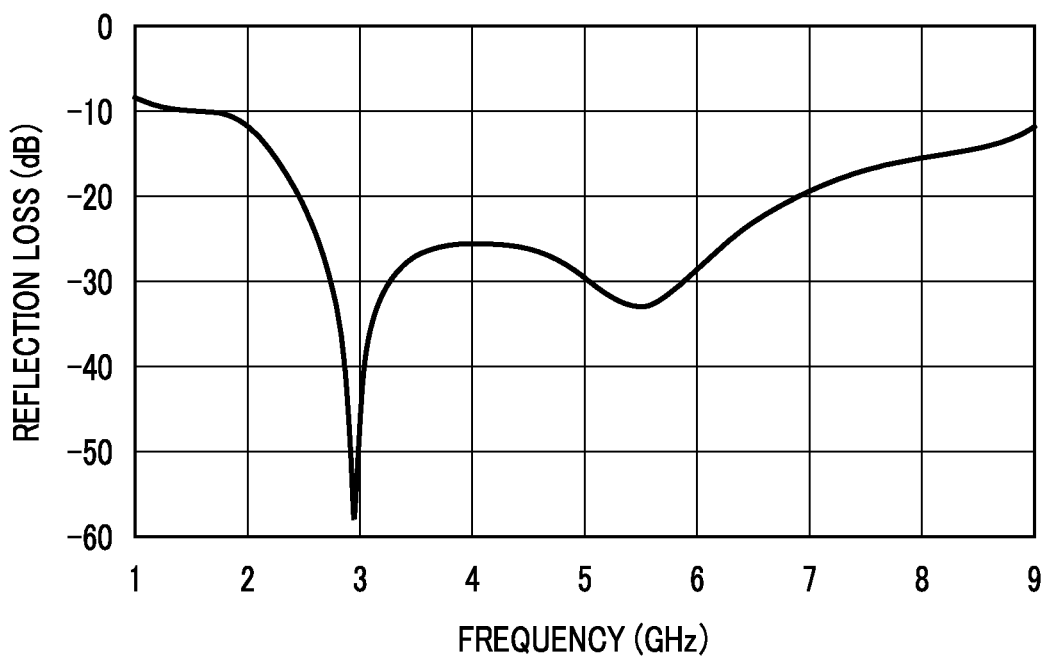
FIG. 20 is a characteristic chart showing the frequency characteristic of reflection loss in a second input/output terminal in the model of the first practical example.

FIG. 19 is a characteristic chart showing the frequency characteristic of the reflection loss of the first input/output port 11 in the model of the first practical example. FIG. 20 is a characteristic chart showing the frequency characteristic of the reflection loss of the second input/output port 12 in the model of the first practical example. In each of FIGS. 19 and 20, the horizontal axis indicates the frequency, and the vertical axis indicates the reflection loss. When the reflection loss of the first input/output port 11 was expressed as −r1 (dB), the value of r1 was 18.05 at 2400 MHz, 19.27 at 5000 MHz, and 29.86 at 6000 MHz. When the reflection loss of the second input/output port 12 was expressed as −r2 (dB), the value of r2 was 19.27 at 2400 MHz, 29.41 at 5000 MHz, and 28.93 at 6000 MHz.

The results shown in FIGS. 13 and 17 indicate that the bandwidth where the isolation was −10 dB or less in the model of the first practical example was 10.8 times the bandwidth where the isolation was −10 dB or less in the model of the comparison model. According to the present embodiment, the frequency band where the isolation I is a prescribed value or less can thus be widened. In addition, the results shown in FIGS. 18 to 20 indicate that the model of the first practical example has the characteristic sufficient for practical use in a wide frequency band of 2400 to 6000 MHz, for example. According to the present embodiment, the electronic component 1 can thus be used in a wide frequency band.

The bandwidth where the isolation is −10 dB or less in the electronic component 51 of the comparative example may be made equal to the bandwidth of the electronic component 1 according to the present embodiment by a method of, for example, connecting in cascade a plurality of (for example, ten or more) circuit sections, each constituted of the inductors L51 and L52, the capacitor C51, and the resistor element R51, as disclosed in JP 2000-77873 A. However, this causes an increase in size of the electronic component 51. By contrast, according to the present embodiment, the frequency band where the isolation is a prescribed value or less can thus be widened without causing an increase in size of the electronic component 1.

Second Embodiment

Figure 21:
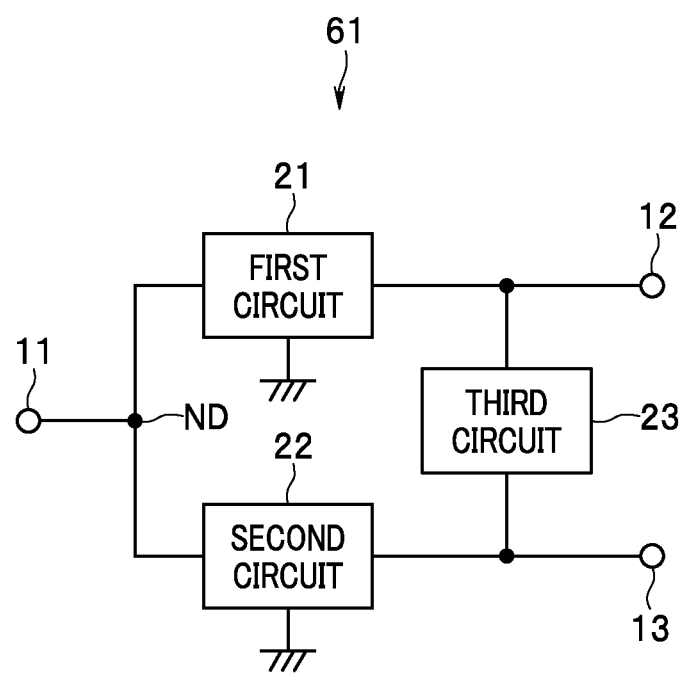
FIG. 21 is a block diagram showing a configuration of an electronic component according to a second embodiment of the present disclosure.
Figure 22:
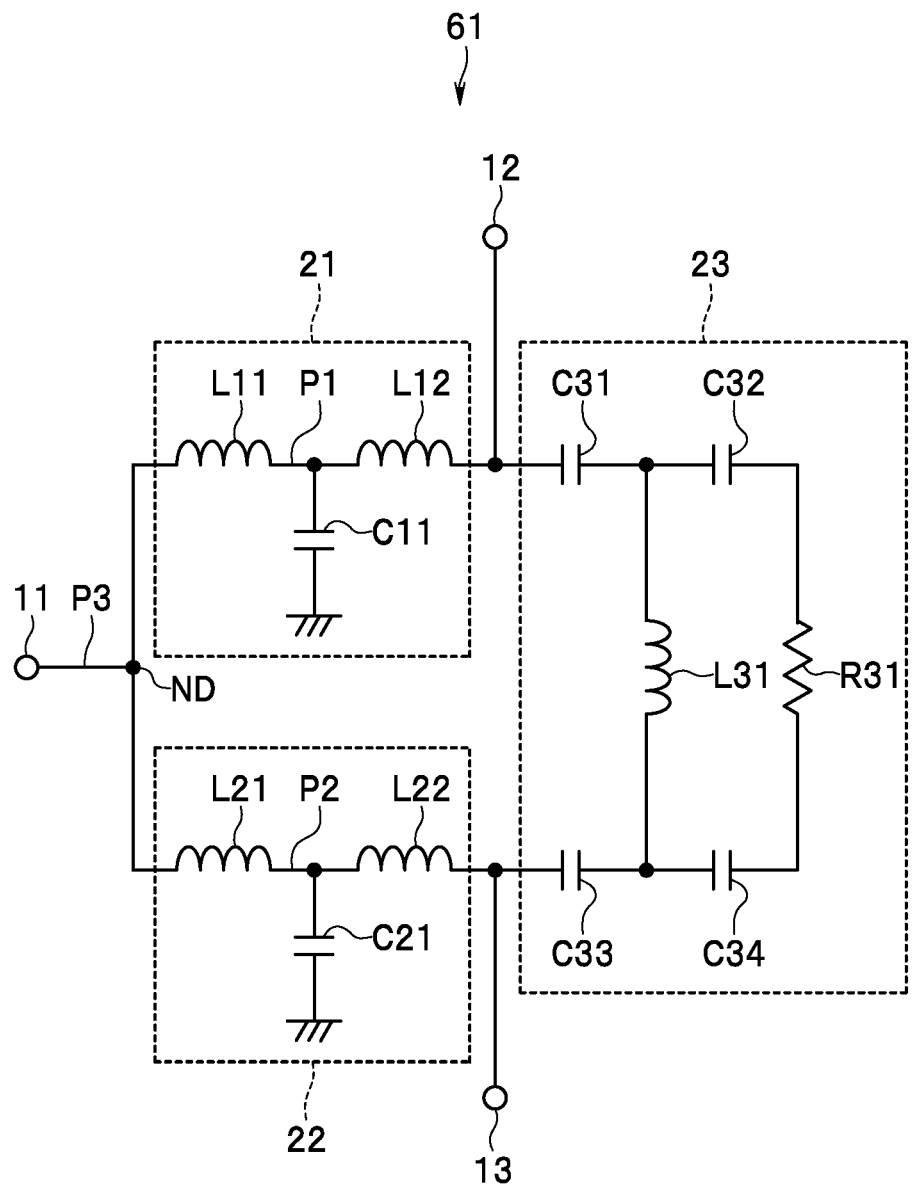
FIG. 22 is a circuit diagram showing a circuit configuration of the electronic component according to the second embodiment of the present disclosure.

Next, a second embodiment of the present disclosure will be described. First, the configuration of an electronic component according to the present embodiment will be described with reference to FIGS. 21 and 22. FIG. 21 is a block diagram showing the configuration of the electronic component according to the present embodiment. FIG. 22 is a circuit diagram showing a circuit configuration of the electronic component according to the present embodiment.

The configuration of an electronic component 61 according to the present embodiment is the same as the configuration of the electronic component 1 according to the first embodiment, except that the matching circuit 24 is not provided. In the present embodiment, the first input/output port 11 is connected to the node ND.

Next, with reference to the result of simulation, an example of the characteristic of the electronic component 61 according to the present embodiment will be described. In the simulation, a model of a second practical example that is a model of the electronic component 61 according to the present embodiment was used to examine isolation, insertion loss, reflection loss of the first input/output port 11, and reflection loss of the second input/output port 12. The definition of the isolation, the insertion loss, the reflection loss of the first input/output port 11, and the reflection loss of the second input/output port 12 in the electronic component 61 according to the present embodiment is the same as the definition of the isolation I, the insertion loss IL, the reflection loss RL1 of the first input/output port 11, and the reflection loss RL2 of the second input/output port 12 in the electronic component 1 according to the first embodiment.

Figure 23:
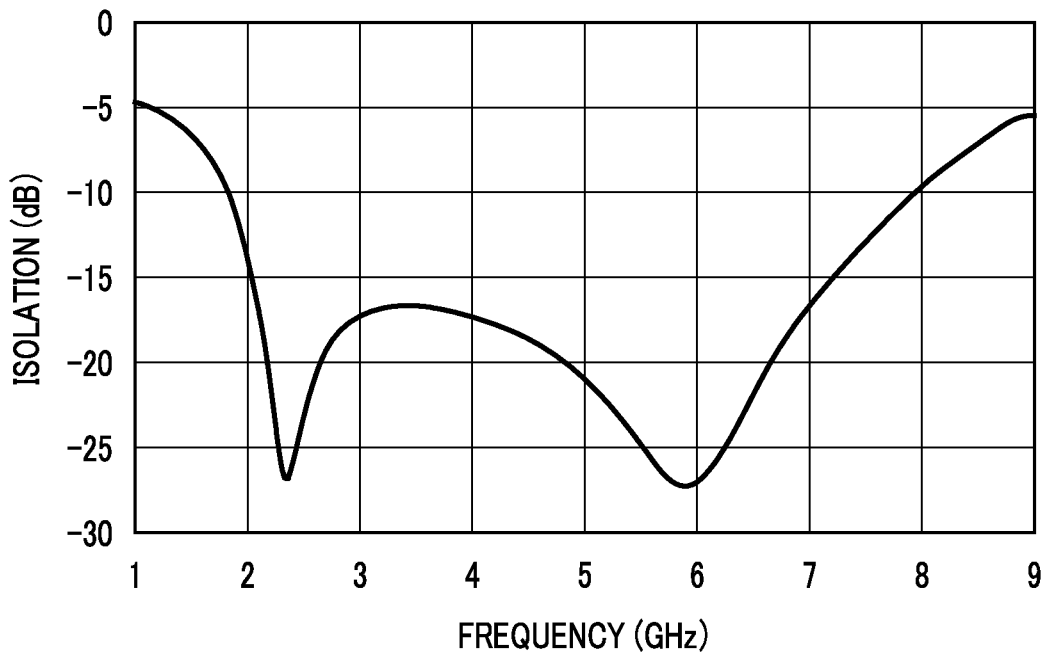
FIG. 23 is a characteristic chart showing the frequency characteristic of isolation in a model of a second practical example.

FIG. 23 is a characteristic chart showing the frequency characteristic of isolation in the model of the second practical example. In FIG. 23, the horizontal axis indicates the frequency, and the vertical axis indicates the isolation. In the model of the second practical example, the isolation was −10 dB or less in the frequency range of 1805 to 7983 MHz. Therefore, the bandwidth where the isolation was −10 dB or less was 6178 MHz. The specific bandwidth, which was a value obtained by dividing the bandwidth by the center frequency, was 126.2%.

Figure 24:
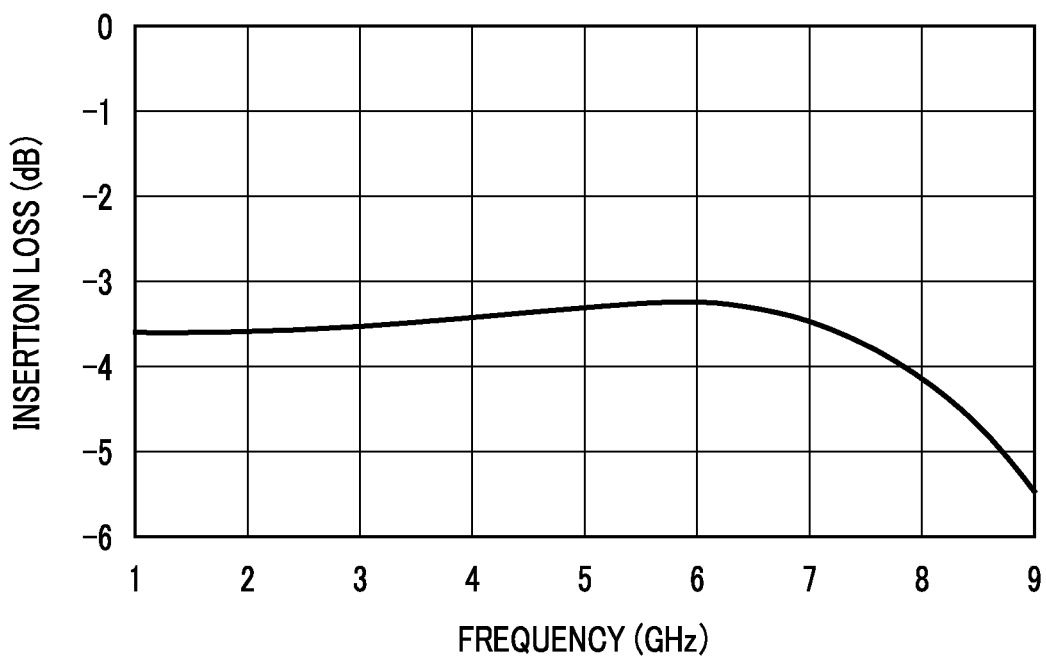
FIG. 24 is a characteristic chart showing the frequency characteristic of insertion loss in the model of the second practical example.

FIG. 24 is a characteristic chart showing the frequency characteristic of insertion loss in the model of the second practical example. In FIG. 24, the horizontal axis indicates the frequency, and the vertical axis indicates the insertion loss. When the insertion loss was expressed as −x (dB), the value of x was 3.57 at 2400 MHz, and 3.28 at 6000 MHz.

Figure 25:
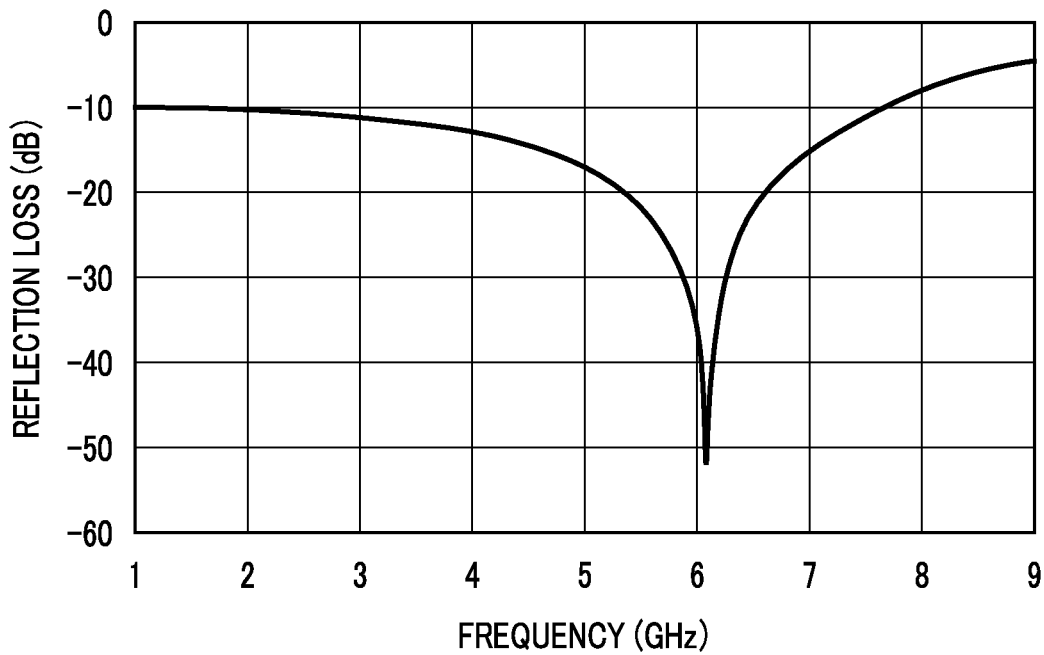
FIG. 25 is a characteristic chart showing the frequency characteristic of reflection loss in a first input/output terminal in the model of the second practical example.
Figure 26:
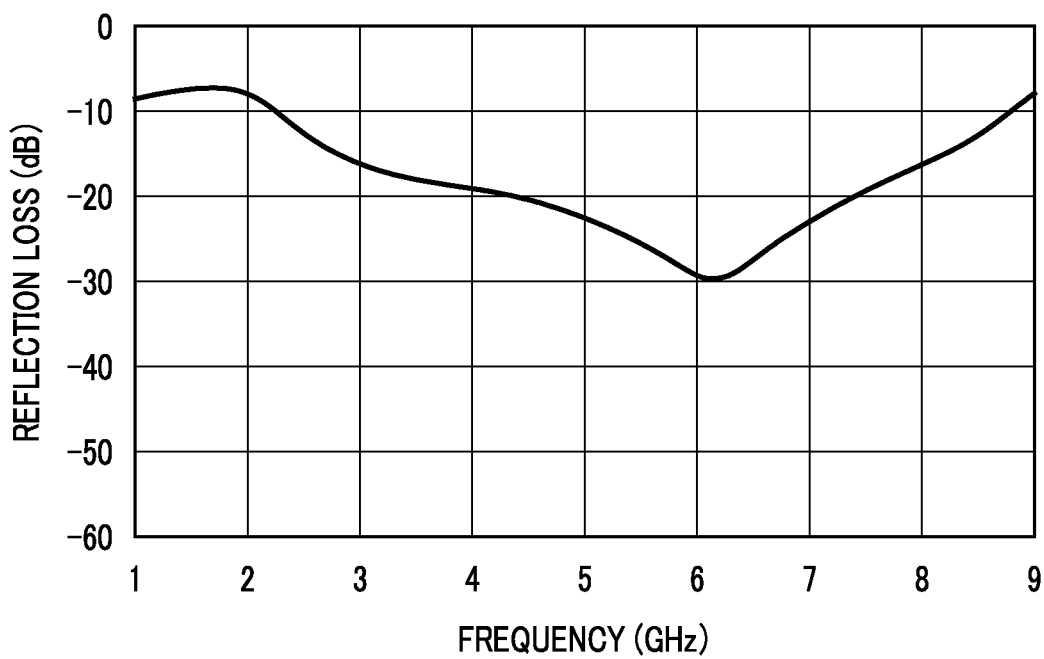
FIG. 26 is a characteristic chart showing the frequency characteristic of reflection loss in a second input/output terminal in the model of the second practical example.

FIG. 25 is a characteristic chart showing the frequency characteristic of the reflection loss of the first input/output port 11 in the model of the second practical example. FIG. 26 is a characteristic chart showing the frequency characteristic of the reflection loss of the second input/output port 12 in the model of the second practical example. In each of FIGS. 25 and 26, the horizontal axis indicates the frequency, and the vertical axis indicates the reflection loss. When the reflection loss of the first input/output port 11 was expressed as −r1 (dB), the value of r1 was 10.66 at 2400 MHz, 17.03 at 5000 MHz, and 39.21 at 6000 MHz. When the reflection loss of the second input/output port 12 was expressed as −r2 (dB), the value of r2 was 11.62 at 2400 MHz, 22.65 at 5000 MHz, and 29.34 at 6000 MHz.

The result shown in FIG. 25 indicates that the bandwidth where the isolation was −10 dB or less in the model of the second practical example was substantially identical to the bandwidth where the isolation was −10 dB or less in the model of the first practical example described in the first embodiment. According to the present embodiment, the frequency band where the isolation is a prescribed value or less can thus be widened. In addition, the results shown in FIGS. 24 to 26 indicate that the model of the second practical example has the characteristic sufficient for practical use in a wide frequency band of 2400 to 6000 MHz, for example. According to the present embodiment, the electronic component 61 can thus be used in a wide frequency band.

In other respects, the configuration, operation and effects in the present embodiment are the same as those of the first embodiment.

Third Embodiment

Figure 27:
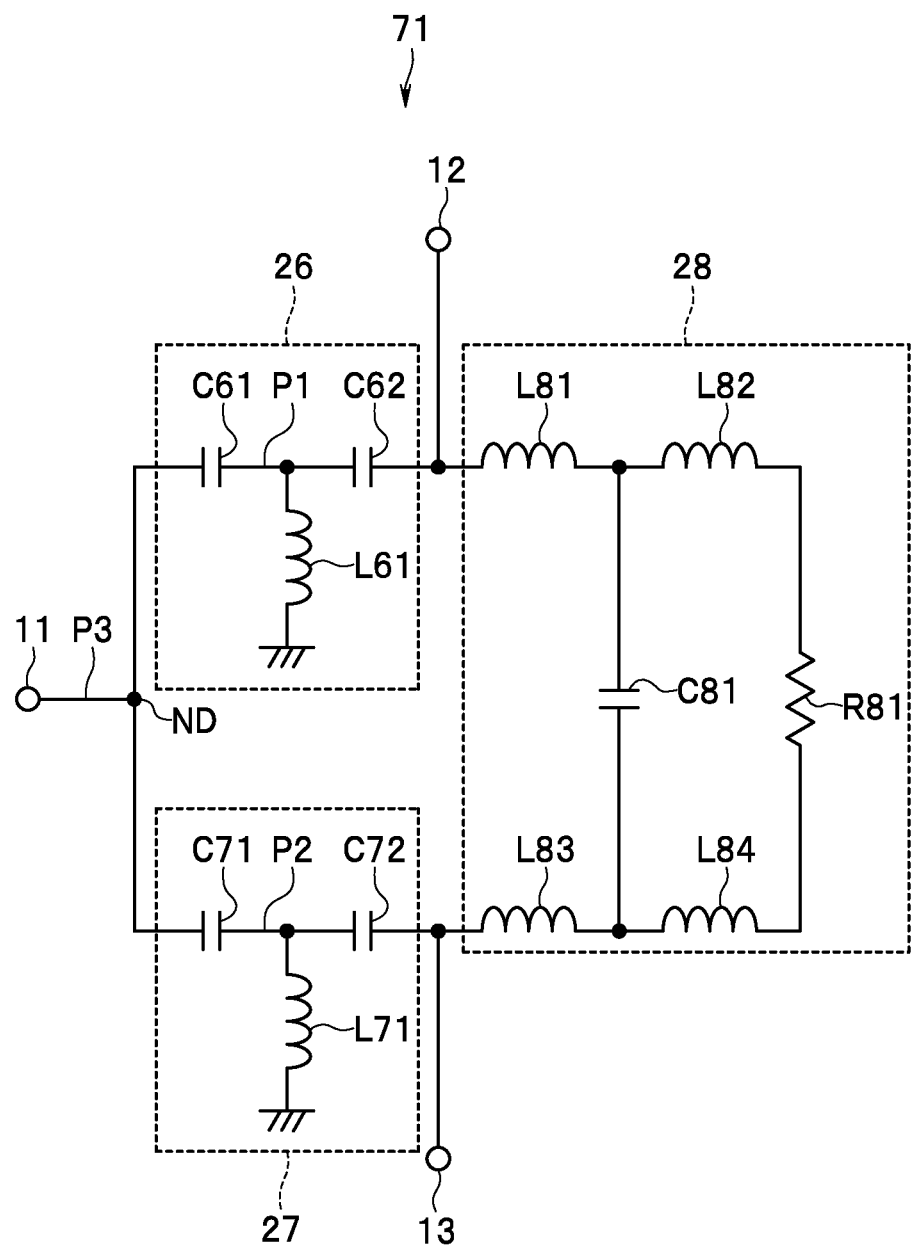
FIG. 27 is a circuit diagram showing a circuit configuration of an electronic component according to a third embodiment of the present disclosure.

Next, a third embodiment of the present disclosure will be described with reference to FIG. 27. An electronic component 71 according to the present embodiment is different from the electronic component 61 according to the second embodiment in the following point. The electronic component 71 according to the present embodiment includes a first circuit 26, a second circuit 27, and a third circuit 28 instead of the first to third circuits 21 to 23 in the second embodiment. The layout of the first to third circuits 26 to 28 in the electronic component 71 in the circuit configuration is the same as the layout of the first to third circuits 21 to 23 in the electronic component 61 according to the second embodiment in the circuit configuration. The third circuit 28 has a circuit configuration where a complex conjugate relationship is made with each of the first and second circuits 26 and 27. The functions of the first to third circuits 26 to 28 are the same as those of the first to third circuits 21 to 23 in the second embodiment, respectively.

The first circuit 26 includes at least one first capacitor provided in a first path P1 that connects the first input/output port 11 and the second input/output port 12, and at least one first inductor provided between the first path P1 and the ground. The second circuit 27 includes at least one second capacitor provided in a second path P2 that connects the first input/output port 11 and the third input/output port 13, and at least one second inductor provided between the second path P2 and the ground.

The third circuit 28 includes at least one third inductor connected in series with the at least one first capacitor, at least one fourth inductor connected in series with the at least one second capacitor, and at least one third capacitor. The third circuit 28 further includes a resistor element R81. The at least one third capacitor and the resistor element R81 are provided in parallel between the at least one third inductor and the at least one fourth inductor. The third circuit 28 has a circuit configuration that is symmetrical about the at least one third capacitor and the resistor element R81.

The specific circuit configuration of the electronic component 71 according to the present embodiment will be described below with reference to FIG. 27. As shown in FIG. 27, the first circuit 26 includes two first capacitors C61 and C62, and one first inductor L61. One end of the first capacitor C61 is connected to the node ND. The other end of the first capacitor C61 is connected to one end of the first capacitor C62 and one end of the first inductor L61. The other end of the first capacitor C62 is connected to the second input/output port 12. The other end of the first inductor L61 is connected to the ground.

The second circuit 27 is similar in configuration to the first circuit 26. Specifically, the second circuit 27 includes two second capacitors C71 and C72, and one second inductor L71. One end of the second capacitor C71 is connected to the node ND. The other end of the second capacitor C71 is connected to one end of the second capacitor C72 and one end of the second inductor L71. The other end of the second capacitor C72 is connected to the third input/output port 13. The other end of the second inductor L71 is connected to the ground.

The third circuit 28 includes two third inductors L81 and L82 that are connected in series with the first capacitors C61 and C62, two fourth inductors L83 and L84 that are connected in series with the second capacitors C71 and C72, and one third capacitor C81. One end of the third inductor L81 is connected to the other end of the first capacitor C62 and the second input/output port 12. The other end of the third inductor L81 is connected to one end of the third inductor L82 and one end of the third capacitor C81. One end of the fourth inductor L83 is connected to the other end of the second capacitor C72 and the third input/output port 13. The other end of the fourth inductor L83 is connected to one end of the fourth inductor L84 and the other end of the third capacitor C81.

The other end of the third inductor L82 is connected to one end of the resistor element R81. The other end of the fourth inductor L84 is connected to the other end of the resistor element R81.

The electronic component 71 may have a matching circuit provided between the first input/output port 11 and the first and second circuits 26 and 27, in the circuit configuration, as in the case of the electronic component 1 according to the first embodiment. In other respects, the configuration, operation and effects in the present embodiment are the same as those of the first embodiment or the second embodiment.

Fourth Embodiment

Figure 28:
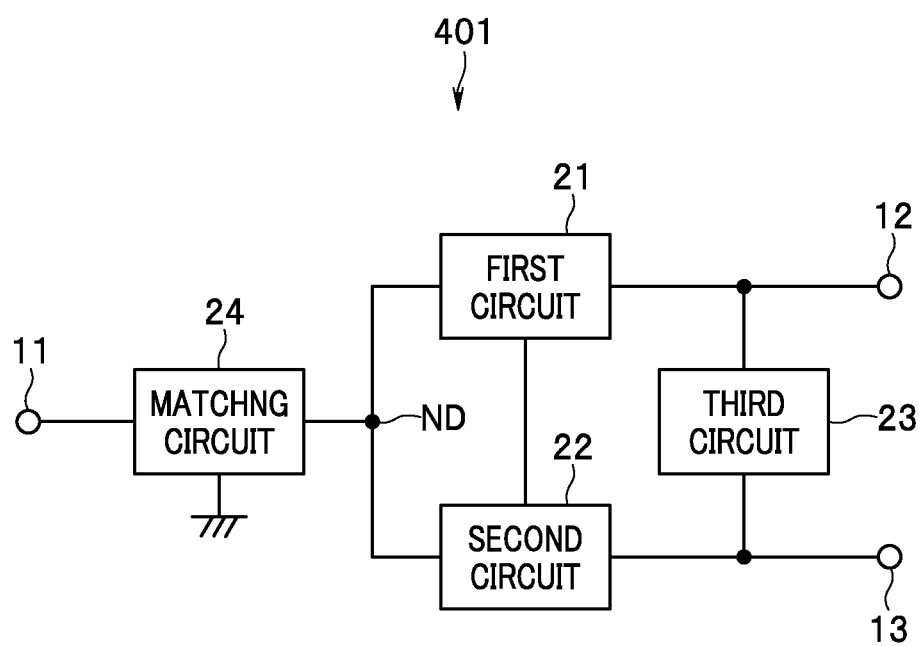
FIG. 28 is a block diagram showing a configuration of an electronic component according to a fourth embodiment of the present disclosure.
Figure 29:
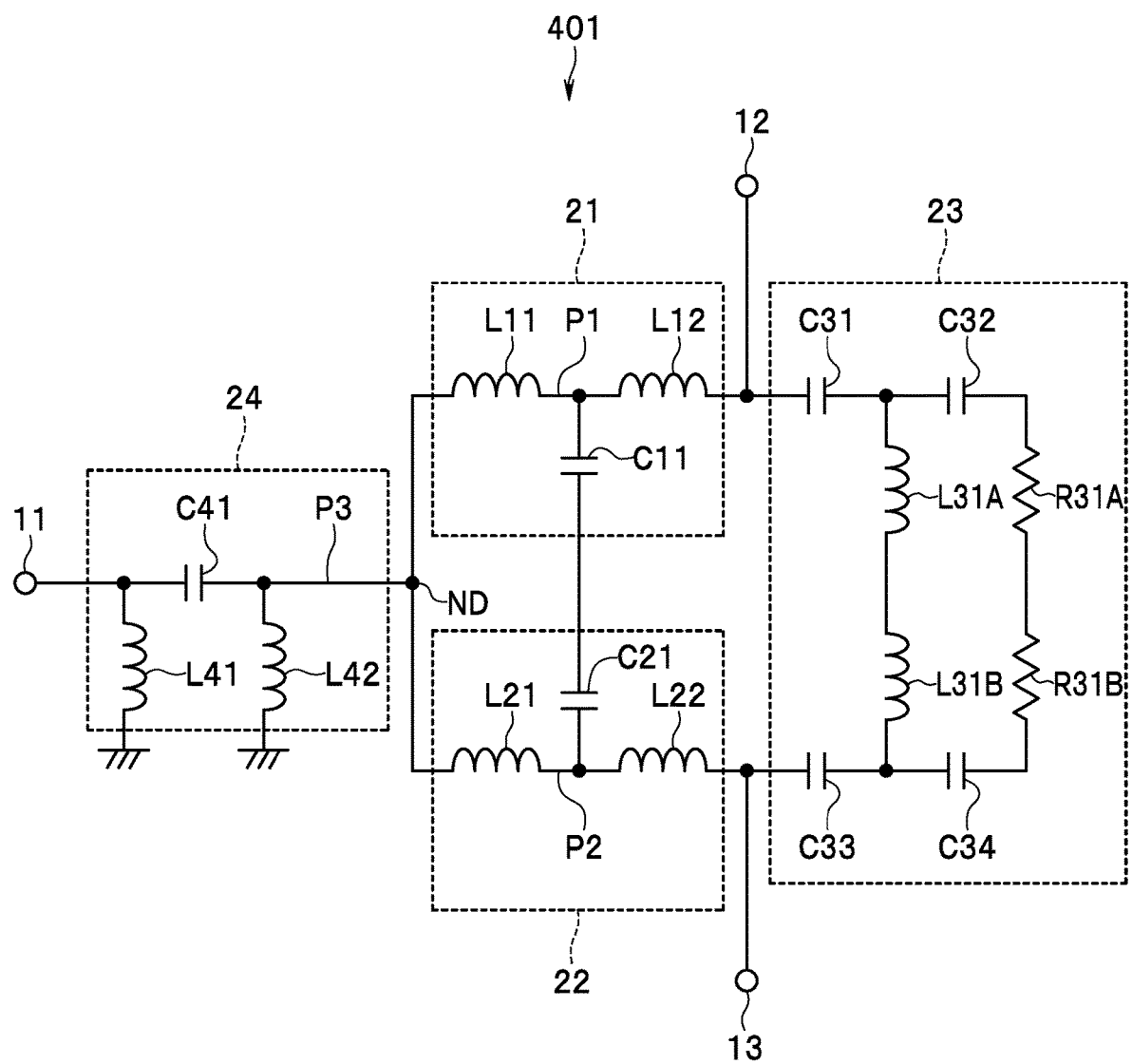
FIG. 29 is a circuit diagram showing a circuit configuration of the electronic component according to the fourth embodiment of the present disclosure.

Next, a fourth embodiment of the present disclosure will be described. First, the configuration of an electronic component according to the present embodiment will be described with reference to FIGS. 28 and 29. FIG. 28 is a block diagram showing the configuration of the electronic component according to the present embodiment. FIG. 29 is a circuit diagram showing a circuit configuration of the electronic component according to the present embodiment.

The configuration of an electronic component 401 according to the present embodiment is basically the same as the configuration of the electronic component 1 according to the first embodiment. Specifically, the electronic component 401 includes the first to third input/output ports 11 to 13, the first to third circuits 21 to 23, and the matching circuit 24.

The configuration of the first to third circuits 21 to 23 and the matching circuit 24 is the same as that of the first embodiment except for the following point. In the present embodiment, the first circuit 21 and the second circuit 22 are connected through a plurality of paths without via the third circuit 23. In the present embodiment in particular, the first circuit 21 and the second circuit 22 are connected through one path via the node ND and through another path without via the node ND and the third circuit 23. Each of the first circuit 21 and the second circuit 22 is not connected to the ground.

In the present embodiment, the first capacitor C11 of the first circuit 21 and the second capacitor C21 of the second circuit 22 are connected to each other as shown in FIG. 29. The path connecting the first capacitor C11 and the second capacitor C21 corresponds to the aforementioned "another path without via the node ND and the third circuit 23".

The third circuit 23 also includes two inductors L31A and L31B connected in series and two resistor elements R31A and R31B connected in series, instead of the third inductor L31 and the resistor element R31 in the first embodiment. One end of the inductor L31A is connected to one end of each of the third capacitors C31 and C32. One end of the inductor L31B is connected to one end of each of the fourth capacitors C33 and C34. The other ends of the inductors L31A and L31B are connected to each other.

One end of the resistor element R31A is connected to the other end of the third capacitor C32. One end of the resistor element R31B is connected to the other end of the fourth capacitor C34. The other ends of the resistor elements R31A and R31B are connected to each other.

Next, with reference to the result of simulation, examples of the characteristic of the electronic component 401 according to the present embodiment will be described. In the simulation, a model of a third practical example that is a model of the electronic component 401 according to the present embodiment was used to examine isolation, insertion loss, reflection loss of the first input/output port 11, and reflection loss of the second input/output port 12. The definition of the isolation, the insertion loss, the reflection loss of the first input/output port 11, and the reflection loss of the second input/output port 12 in the electronic component 401 according to the present embodiment is the same as the definition of the isolation I, the insertion loss IL, the reflection loss RL1 of the first input/output port 11, and the reflection loss RL2 of the second input/output port 12 in the electronic component 1 according to the first embodiment.

Figure 30:
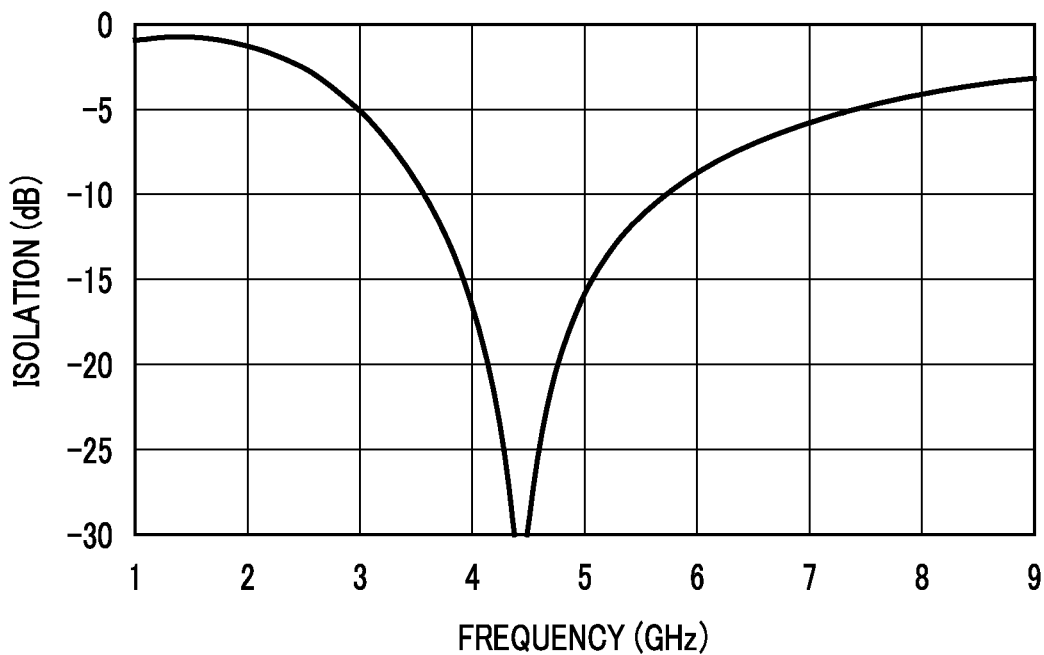
FIG. 30 is a characteristic chart showing the frequency characteristic of isolation in a model of a third practical example.

FIG. 30 is a characteristic chart showing the frequency characteristic of isolation in the model of the third practical example. In FIG. 30, the horizontal axis indicates the frequency, and the vertical axis indicates the isolation. In the model of the third practical example, the isolation was −10 dB or less in the frequency range of 3574 to 5719 MHz. Therefore, the bandwidth where the isolation was −10 dB or less was 2145 MHz. The specific bandwidth, which was a value obtained by dividing the bandwidth by the center frequency, was 46.2%.

Figure 31:
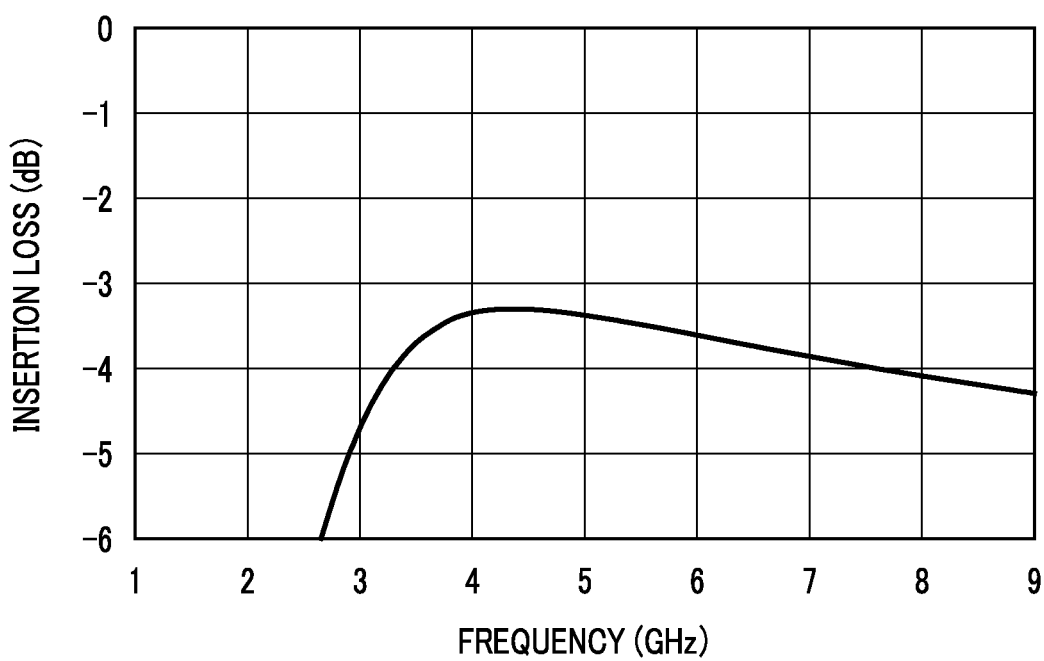
FIG. 31 is a characteristic chart showing the frequency characteristic of insertion loss in the model of the third practical example.

FIG. 31 is a characteristic chart showing the frequency characteristic of insertion loss in the model of the third practical example. In FIG. 31, the horizontal axis indicates the frequency, and the vertical axis indicates the insertion loss. When the insertion loss was expressed as −x (dB), the value of x was 3.62 at 3574 MHz, and 3.55 at 5179 MHz.

Figure 32:
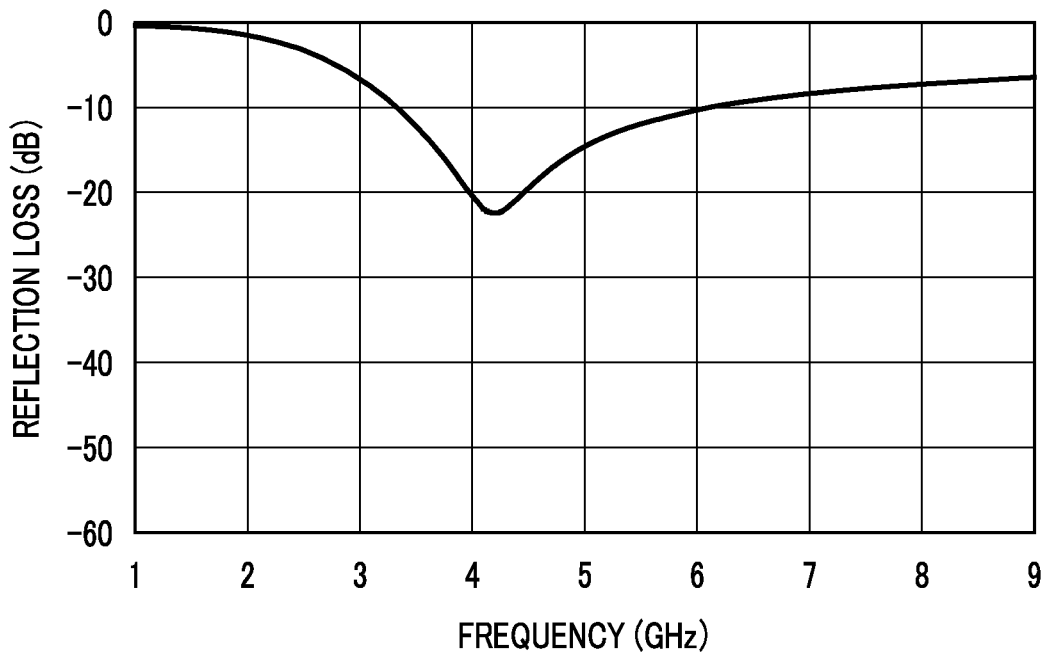
FIG. 32 is a characteristic chart showing the frequency characteristic of reflection loss in a first input/output terminal in the model of the third practical example.
Figure 33:
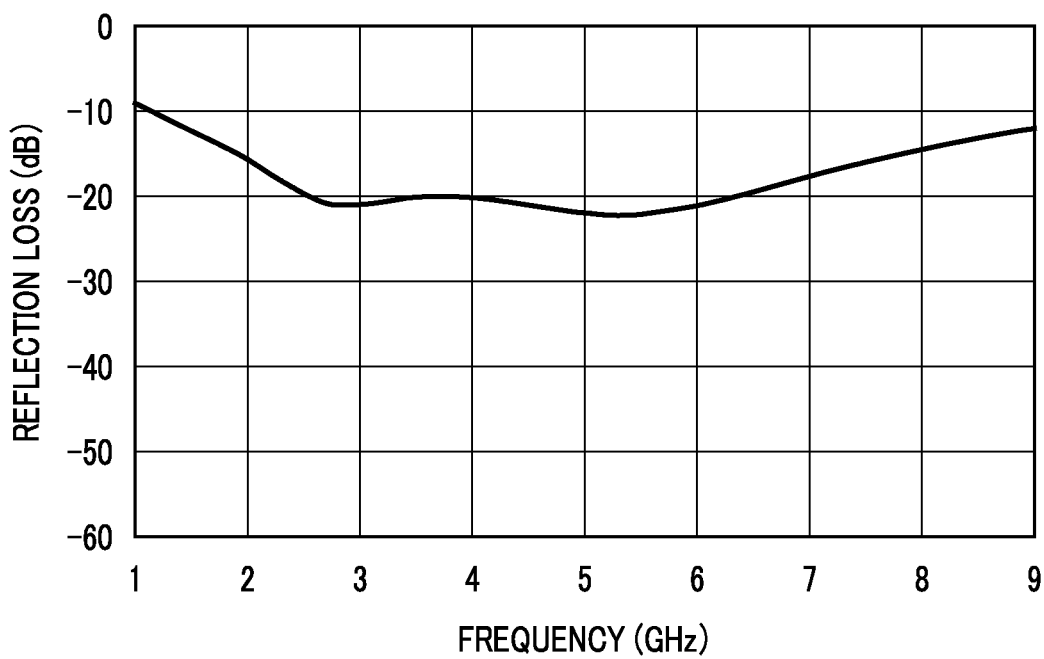
FIG. 33 is a characteristic chart showing the frequency characteristic of reflection loss in a second input/output terminal in the model of the third practical example.

FIG. 32 is a characteristic chart showing the frequency characteristic of the reflection loss of the first input/output port 11 in the model of the third practical example. FIG. 33 is a characteristic chart showing the frequency characteristic of the reflection loss of the second input/output port 12 in the model of the third practical example. In each of FIGS. 32 and 33, the horizontal axis indicates the frequency, and the vertical axis indicates the reflection loss. When the reflection loss of the first input/output port 11 was expressed as −r1 (dB), the value of r1 was 13.17 at 3574 MHz, and 11.13 at 5179 MHz. When the reflection loss of the second input/output port 12 was expressed as −r2 (dB), the value of r2 was 20.09 at 3574 MHz, and 21.83 at 5179 MHz.

The result shown in FIG. 30 indicates that the bandwidth where the isolation was −10 dB or less in the model of the third practical example was wider than the bandwidth where the isolation was −10 dB or less in the model of the comparative example described in the first embodiment. According to the present embodiment, the frequency band where the isolation is a prescribed value or less can thus be widened. In addition, the results shown in FIGS. 31 to 33 indicate that the model of the third practical example has the characteristic sufficient for practical use in a wide frequency band of 3574 to 5719 MHz, for example. According to the present embodiment, the electronic component 401 can thus be used in a wide frequency band.

The electronic component 401 according to the present embodiment may not have the matching circuit 24 as in the case of the electronic component 61 according to the second embodiment. In other respects, the configuration, operation and effects in the present embodiment are the same as those of the first embodiment or the second embodiment.

Fifth Embodiment

Figure 34:
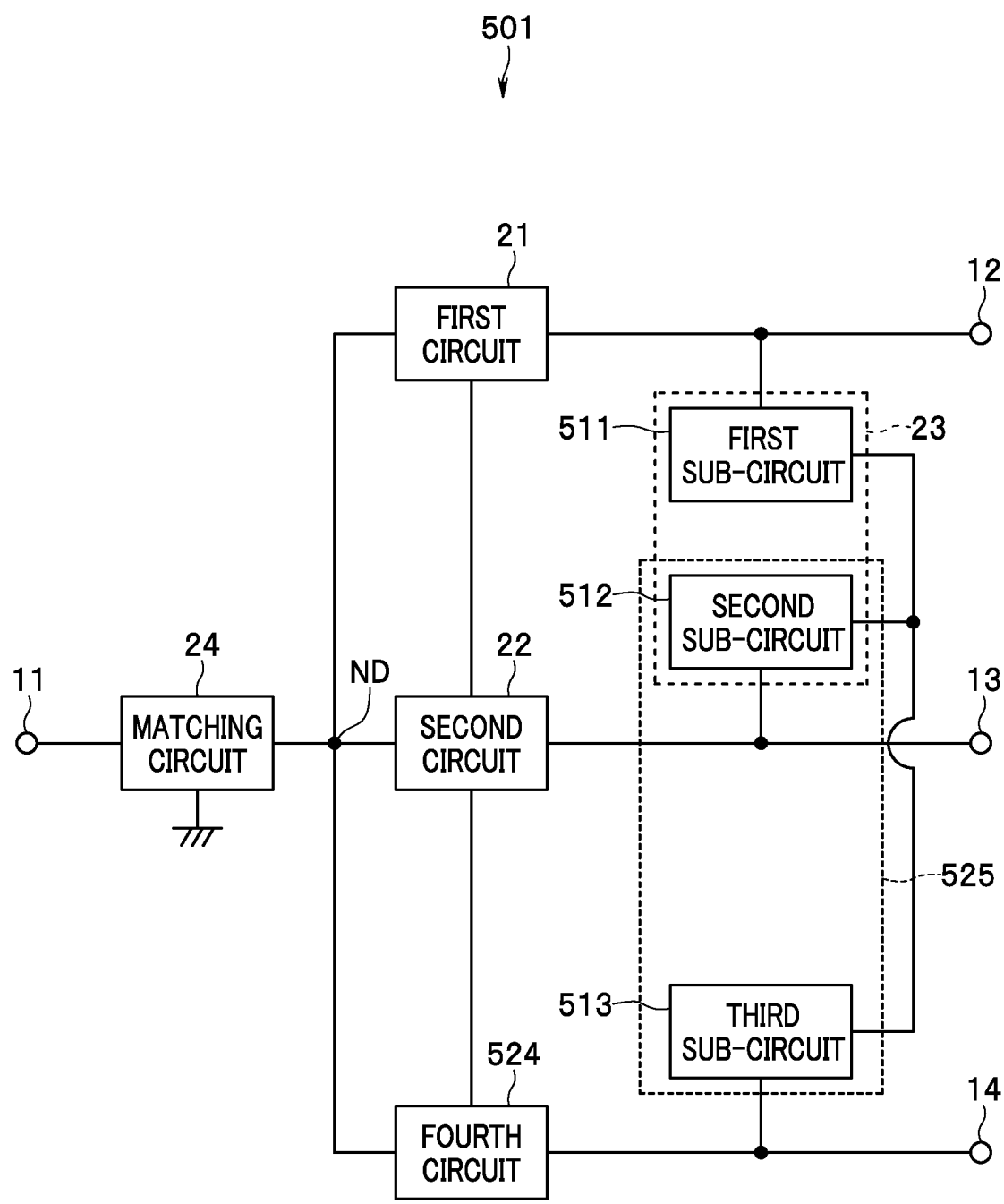
FIG. 34 is a block diagram showing a configuration of an electronic component according to a fifth embodiment of the present disclosure.
Figure 35:
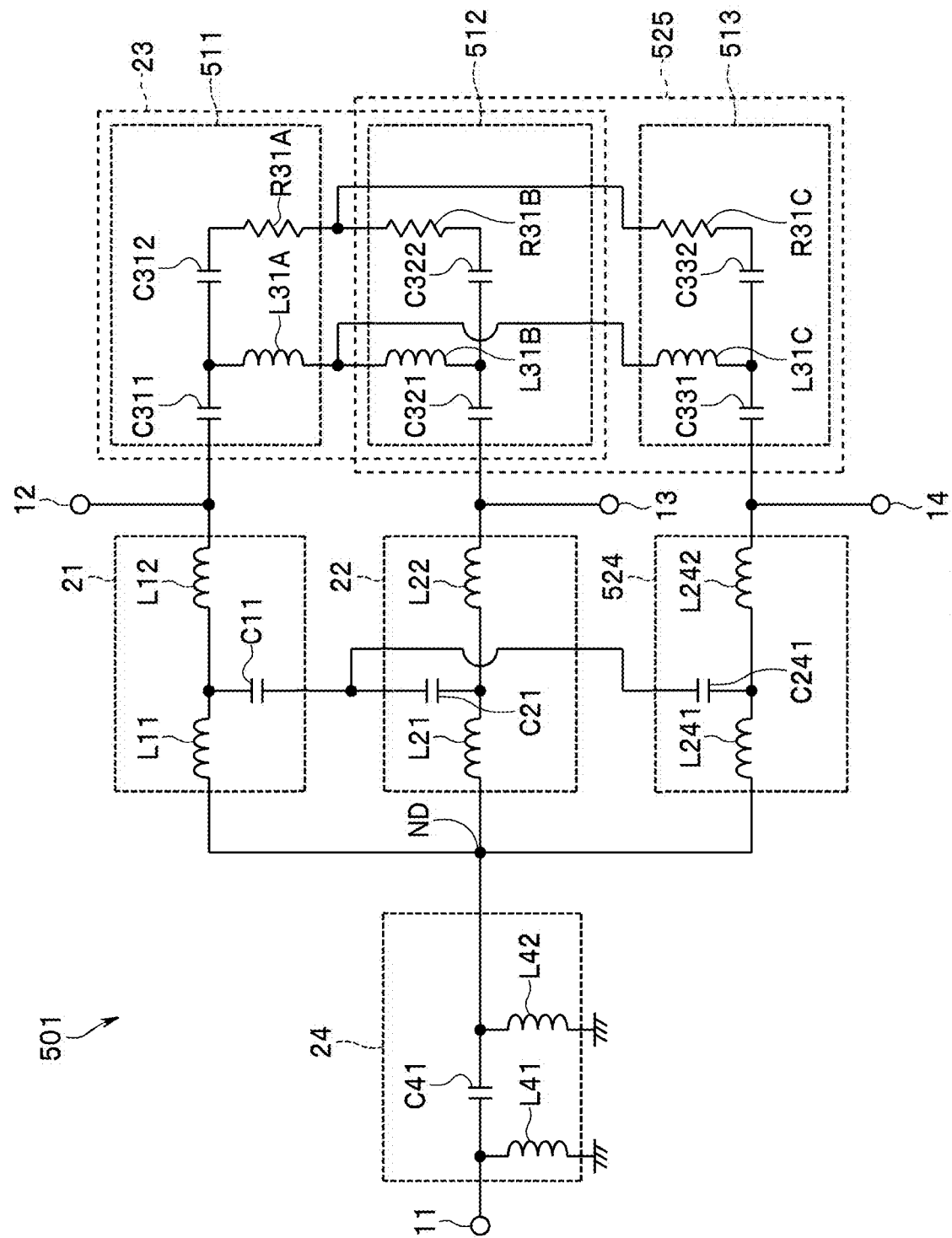
FIG. 35 is a circuit diagram showing a circuit configuration of the electronic component according to the fifth embodiment of the present disclosure.

Next, a fifth embodiment of the present disclosure will be described with reference to FIGS. 34 and 35. FIG. 34 is a block diagram showing the configuration of an electronic component according to the present embodiment. FIG. 35 is a circuit diagram showing a circuit configuration of the electronic component according to the present embodiment.

An electronic component 501 according to the present embodiment is different from the electronic component 401 according to the fourth embodiment in the following point. The electronic component 501 includes the first to third input/output ports 11 to 13, the first to third circuits 21 to 23, and the matching circuit 24, as well as a fourth input/output port 14, a fourth circuit 524, and a fifth circuit 525.

The fourth circuit 524 is provided between the first input/output port 11 and the fourth input/output port 14 in the circuit configuration. The fourth circuit 524 is a characteristic impedance converter circuit used to adjust impedance of the fourth circuit 524 to a prescribed value (for example, 50Ω), as in the case of the first to third circuits 21 to 23.

In the present embodiment, the second circuit 22 is connected to the first circuit 21 through a plurality of paths without via the third circuit 23, and is also connected to the fourth circuit 524 through a plurality of paths without via the fifth circuit 525. In the present embodiment, in particular, the second circuit 22 and the fourth circuit 524 are connected through one path via the node ND and through another path without via the node ND and the fifth circuit 525. Each of the first, second, and fourth circuits 21, 22, and 524 is not connected to the ground.

As shown in FIG. 35, the fourth circuit 524 is similar in configuration to the first and second circuits 21 and 22. Specifically, the fourth circuit 524 includes two inductors L241 and L242, and one capacitor C241. One end of the inductor L241 is connected to the node ND. The other end of the inductor L241 is connected to one end of the inductor L242 and one end of the capacitor C241. The other end of the inductor L242 is connected to the fourth input/output port 14. The other end of the capacitor C241 is connected to a connection point between the first capacitor C11 of the first circuit 21 and the second capacitor C21 of the second circuit 22.

The second capacitor C21 of the second circuit 22 and the capacitor C241 of the fourth circuit 524 are connected to each other as shown in FIG. 35. The path connecting the second capacitor C21 and the capacitor C241 corresponds to the aforementioned "another path without via the node ND and the fifth circuit 525".

The fifth circuit 525 is provided between the third input/output port 13 and the fourth input/output port 14 in the circuit configuration. The fifth circuit 525 is a signal absorbing circuit in which when a signal is input to one of the third input/output port 13 and the fourth input/output port 14, the signal flowing to the other of the third input/output port 13 and the fourth input/output port 14 is absorbed as in the case of the third circuit 23. The fifth circuit 525 has a circuit configuration where a complex conjugate relationship is made with each of the second and fourth circuits 22 and 524. Specifically, the elements constituting the fifth circuit 525 are provided in the fifth circuit 525 so as to be in a complex conjugate relationship with the elements constituting each of the second and fourth circuits 22 and 524.

The electronic component 501 further includes a first sub-circuit 511, a second sub-circuit 512, and a third sub-circuit 513. The first to third sub-circuits 511 to 513 are connected to each other. The third circuit 23 is formed of the first and second sub-circuits 511 and 512. The fifth circuit 525 is formed of the second and third sub-circuits 512 and 513. The second sub-circuit 512 is used for both the third circuit 23 and the fifth circuit 525.

The first sub-circuit 511 includes two capacitors C311 and C312 that are connected in series with the first inductors L11 and L12, an inductor L31A, and a resistor element R31A. The second sub-circuit 512 includes two capacitors C321 and C322 that are connected in series with the second inductors L21 and L22, an inductor L31B, and a resistor element R31B. The third sub-circuit 513 includes two capacitors C331 and C332 that are connected in series with the inductors L241 and L242, an inductor L31C, and a resistor element R31C. The capacitors C311 and C312 correspond to the third capacitors C31 and C32 in the fourth embodiment, respectively, while the capacitors C321 and C322 correspond to the fourth capacitors C33 and C34 in the fourth embodiment, respectively.

One end of the capacitor C311 is connected to the first inductor L12 and the second input/output port 12. The other end of the capacitor C311 is connected to one end of the capacitor C312 and one end of the inductor L31A. One end of the capacitor C321 is connected to the second inductor L22 and the third input/output port 13. The other end of the capacitor C321 is connected to one end of the capacitor C322 and one end of the inductor L31B. One end of the capacitor C331 is connected to the inductor L242 and the fourth input/output port 14. The other end of the capacitor C331 is connected to one end of the capacitor C332 and one end of the inductor L31C. The other ends of the inductors L31A, L31B, and L341C are connected to each other.

The other end of the capacitor C312 is connected to one end of the resistor element R31A. The other end of the capacitor C322 is connected to one end of the resistor element R31B. The other end of the capacitor C332 is connected to one end of the resistor element R31C. The other ends of the resistor elements R31A, R31B, and R31C are connected to each other.

In the present embodiment, the third circuit 23 includes the capacitors C311, C312, C321 and C322, the inductors L31A and L31B, and the resistor elements R31A and R31B. The fifth circuit 525 includes the capacitors C321, C322, C331 and C332, the inductors L31B and L31C, and the resistor elements R31B and R31C. The capacitors C321 and C322, the inductor L31B, and the resistor element R31B are used in both the third circuit 23 and the fifth circuit 525.

When focusing on the second circuit 22, the fourth circuit 524, and the fifth circuit 525 in the electronic component 501 according to the present embodiment, it can be considered that the second circuit 22 corresponds to one of the "first circuit" and the "second circuit" of the present disclosure, the fourth circuit 524 corresponds to the other of the "first circuit" and the "second circuit" of the present disclosure, and the fifth circuit 525 corresponds to the "third circuit" of the present disclosure. In this case, the electronic component 501 according to the present embodiment can be considered as an electronic component including two "first circuits", one "second circuit" and two "third circuits" or including two "second circuits", one "first circuit", and two "third circuits".

In other respects, the configuration, operation and effects in the present embodiment are the same as those of the fourth embodiment.

The present disclosure is not limited to each of the aforementioned embodiments, and various modifications may be made thereto. For example, as long as claim elements are satisfied, the number of the input/output ports on the branch side, as well as the number and layout of the inductors and the capacitors in each circuit, are not limited to those of the examples shown in each embodiment, and may be any number and layout. The number of the input/output ports on the branch side is not limited to two or three, and may be four or more.

The electronic component of the present disclosure is not limited to the configuration shown in FIG. 1 or 21, and may include another circuit such as a filter. In this case, at least one of the first to third input/output ports 11 to 13 may be provided inside the stack 30.

In addition, the first to third circuits of the present disclosure are not limited to a divider and combiner, and may also be applied to electronic components having various functions, such as branching devices, shunt devices, mixers, splitters, dividers, combiners, and 3 dB hybrids.

Moreover, as long as the circuit configuration satisfies the claims, the electronic component of the present disclosure is not limited to the stack 30 described with reference to FIGS. 5 to 11. The electronic component of the present disclosure may be configured using low-temperature co-fired ceramic (LTCC) multilayer substrates, and be configured using discrete elements, i.e. chip capacitors, chip inductors, and chip resistors.

In the third embodiment, the first circuit 26 and the second circuit 27 may be connected through a plurality of paths without via the third circuit 28, as in the case of the first and second circuits 21 and 22 in the fourth embodiment. Specifically, the first inductor L61 of the first circuit 26 and the second inductor L71 of the second circuit 27 may be connected to each other. Each of the first circuit 26 and the second circuit 27 may not be connected to the ground.

In the fifth embodiment, all the first, second, and fourth circuits 21, 22, and 524 may be connected to the ground, as in the case of the first and second circuits 21 and 22 in the first embodiment. In this case, the first capacitor C11 of the first circuit 21, the second capacitor C21 of the second circuit 22, and the capacitor C241 of the fourth circuit 524 may not be connected to each other.

Obviously, many modifications and variations of the present disclosure are possible in the light of the above teachings. Thus, it is to be understood that, within the scope of the appended claims and equivalents thereof, the present disclosure may be practiced in other embodiments than the foregoing embodiments.

What is claimed is:

1. An electronic component comprising:
   a first input/output port;
   a second input/output port;
   a third input/output port;
   a first circuit that is a characteristic impedance converter circuit provided between the first input/output port and the second input/output port;
   a second circuit that is a characteristic impedance converter circuit provided between the first input/output port and the third input/output port; and
   a third circuit provided between the second input/output port and the third input/output port, wherein:
   each of the first to third circuits includes at least one inductor and at least one capacitor;
   the at least one inductor in the third circuit is provided in the third circuit so as to be in a complex conjugate relationship with the at least one capacitor in each of the first and second circuits;
   the at least one capacitor in the third circuit is provided in the third circuit so as to be in a complex conjugate relationship with the at least one inductor in each of the first and second circuits;
   the first circuit includes, as the at least one inductor and the at least one capacitor, a first inductor provided in a first path that connects the first input/output port and the second input/output port, and a first capacitor;
   the second circuit includes, as the at least one inductor and the at least one capacitor, a second inductor provided in a second path that connects the first input/output port and the third input/output port, and a second capacitor; and
   the third circuit includes, as the at least one inductor and the at least one capacitor, a third capacitor connected in series with the first inductor, a fourth capacitor connected in series with the second inductor, and a third inductor.

2. The electronic component according to claim 1, wherein the electronic component is a divider and combiner.

3. The electronic component according to claim 1, wherein:
   the third circuit further includes a resistor element; and
   the third inductor and the resistor element are provided in parallel between the third capacitor and the fourth capacitor.

4. The electronic component according to claim 3, wherein the circuit configuration of the third circuit is a configuration that is symmetrical about the third inductor and the resistor element.

5. The electronic component according to claim 1, wherein:
the first capacitor and the second capacitor are connected to each other.

6. The electronic component according to claim 1, further comprising a matching circuit provided between the first input/output port and the first and second circuits.

7. The electronic component according to claim 6, wherein:
the first circuit, the second circuit, and the matching circuit branch from one node; and
the matching circuit includes a matching circuit capacitor provided in a third path that connects the first input/output port and the node, and a matching circuit inductor provided between the third path and a ground.

8. The electronic component according to claim 1, wherein the first circuit and the second circuit are each connected to a ground.

9. The electronic component according to claim 1, wherein the first circuit and the second circuit are connected through a plurality of paths without via the third circuit.

10. The electronic component according to claim 9, wherein each of the first circuit and the second circuit is not connected to a ground.

11. The electronic component according to claim 1, further comprising:
a fourth input/output port;
a fourth circuit that is a characteristic impedance converter circuit provided between the first input/output port and the fourth input/output port; and
a fifth circuit provided between the third input/output port and the fourth input/output port, the fifth circuit having a circuit configuration where a complex conjugate relationship is made with each of the second and fourth circuits.

12. The electronic component according to claim 11, wherein the second circuit is connected to the first circuit through a plurality of paths without via the third circuit, and is connected to the fourth circuit through a plurality of paths without via the fifth circuit.

13. The electronic component according to claim 1, wherein:

the first capacitor is provided between the first path and the ground; and
the second capacitor is provided between the second path and the ground.

14. A communication apparatus comprising:
an electronic component; and
at least one antenna that is connected to the electronic component, wherein:
the electronic component comprises:
a first input/output port;
a second input/output port;
a third input/output port;
a first circuit that is a characteristic impedance converter circuit provided between the first input/output port and the second input/output port;
a second circuit that is a characteristic impedance converter circuit provided between the first input/output port and the third input/output port; and
a third circuit provided between the second input/output port and the third input/output port;
each of the first to third circuits includes at least one inductor and at least one capacitor;
the at least one inductor in the third circuit is provided in the third circuit so as to be in a complex conjugate relationship with the at least one capacitor in each of the first and second circuits;
the at least one capacitor in the third circuit is provided in the third circuit so as to be in a complex conjugate relationship with the at least one inductor in each of the first and second circuits;
the first circuit includes, as the at least one inductor and the at least one capacitor, a first inductor provided in a first path that connects the first input/output port and the second input/output port, and a first capacitor;
the second circuit includes, as the at least one inductor and the at least one capacitor, a second inductor provided in a second path that connects the first input/output port and the third input/output port, and a second capacitor; and
the third circuit includes, as the at least one inductor and the at least one capacitor, a third capacitor connected in series with the first inductor, a fourth capacitor connected in series with the second inductor, and a third inductor.

* * * * *